United States Patent
Takahashi et al.

(10) Patent No.: US 6,933,750 B2
(45) Date of Patent: Aug. 23, 2005

(54) BUFFER CIRCUIT, BUFFER TREE, AND SEMICONDUCTOR DEVICE

(75) Inventors: Hiroyuki Takahashi, Kanagawa (JP); Hiroyuki Satake, Kanagawa (JP)

(73) Assignee: NEC Electronics Corporation (JP)

( * ) Notice: Subject to any disclaimer, the term of this patent is extended or adjusted under 35 U.S.C. 154(b) by 12 days.

(21) Appl. No.: 10/620,659

(22) Filed: Jul. 16, 2003

(65) Prior Publication Data

US 2004/0012412 A1 Jan. 22, 2004

(30) Foreign Application Priority Data

Jul. 19, 2002 (JP) ......................................... 2002-210628

(51) Int. Cl.[7] ......................................... H03K 19/0175
(52) U.S. Cl. ............................. 326/82; 326/83; 326/86
(58) Field of Search .............................. 326/81–83, 93, 326/95; 327/142, 198, 210, 176, 291, 299

(56) References Cited

U.S. PATENT DOCUMENTS

| | | | | |
|---|---|---|---|---|
| 5,661,415 A | * | 8/1997 | Aoki et al. ..................... | 326/82 |
| 6,181,182 B1 | * | 1/2001 | Stotz et al. .................. | 327/256 |
| 6,310,499 B1 | * | 10/2001 | Radjassamy ................ | 327/175 |
| 6,549,039 B1 | * | 4/2003 | Rosen .......................... | 326/93 |
| 6,577,165 B1 | * | 6/2003 | Cheung et al. ............... | 326/93 |
| 6,696,863 B2 | * | 2/2004 | Yamamoto et al. ........... | 326/93 |

FOREIGN PATENT DOCUMENTS

| | | | | |
|---|---|---|---|---|
| JP | 05-048410 | 2/1993 | ............ | H03K/5/01 |
| JP | 08-321768 | 12/1996 | ....... | H03K/19/0175 |
| JP | 11-353066 | 12/1999 | ............ | H06F/3/00 |

* cited by examiner

Primary Examiner—Vibol Tan
(74) Attorney, Agent, or Firm—Hayes Soloway P.C.

(57) ABSTRACT

A buffer circuit includes first and second transistors which are connected in series between first and second power supplies and which are controlled to be on/off based on values of signals at their control terminals are provided, in which a connection point between the two transistors is connected to an output terminal (OUT) and a control terminal of the first transistor is connected to an input terminal (IN), and a control circuit for performing on/off control over the second transistor based on an input signal from the input terminal (IN). The control circuit performs control so that when the input signal is at a second logic level corresponding to the second power supply, the second transistor is turned off, when the input signal goes to a first logic level corresponding to the first power supply, the second transistor is turned on to cause the output terminal (OUT) to a second power supply voltage, next, when the second transistor is turned off and then the input signal undergoes a transition from the first logic level to the second logic level and the first transistor switches from off to on, with the second transistor being kept off. A flip-flop is connected to the output terminal (OUT).

17 Claims, 16 Drawing Sheets

BUFFER CIRCUIT, BUFFER TREE, AND SEMICONDUCTOR DEVICE

FIELD OF THE INVENTION

The present invention relates to a buffer circuit. Specifically, the invention relates to a buffer circuit suitable for a buffer for driving a clock signal and a semiconductor integrated circuit.

BACKGROUND OF THE INVENTION

Recently, in semiconductor integrated circuits such as high-speed CMOS circuits, the operating frequency of the circuits has become higher and hence the length of one clock cycle has been reduced. Further, as integration density and function level of a semiconductor integrated circuit become higher, clock interconnections become longer. In a semiconductor integrated circuit with clock synchronous circuits, such as latches or registers, which also perform sampling of data in response to a clock transition, a clock tree system is employed. This technique allows for matching delays from a clock source, such as a clock input pin or an internal clock generation circuit, to the respective clock synchronous circuits, and thereby performing clock distribution. In the clock tree system, as shown in FIG. 12, clock buffer circuits (also referred to as "CTS (Clock Tree Synthesis) buffer circuits) INV101 to INV117 are disposed along clock propagation paths. A conventional clock buffer circuit is comprised of a PMOS transistor and an NMOS transistor. In case wherein the clock buffer circuit is composed of a CMOS inverter, an input signal is supplied to commonly coupled gates of a PMOS transistor and an NMOS transistor connected in series between a high-potential power supply and a low-potential power supply, and an output signal of the clock buffer circuit is outputted from a connection point between a drain of the PMOS transistor and the drain of the NMOS transistor. For speeding up a high-level output driven by the PMOS transistor which is turned on, a size of the PMOS transistor is made large, while the size of the NMOS transistor is made small and hence a βp/βn ratio is made large, thereby achieving speeding up the high-level output, where the βp/βn ratio is a ratio of gain coefficients between the PMOS transistor and the NMOS transistor that constitute the CMOS inverter. The β is given by $(\mu\epsilon/t_{ox})(W/L)$, where $\mu$ represents a carrier mobility, $\epsilon$ represents a dielectric constant of a gate dielectric film, $t_{ox}$ represents a thickness of the gate dielectric film, W represents a channel width, and L represents a channel length. However, when achieving the speeding up by increasing the βp/μn ratio, the size of the NMOS transistor must be made especially smaller because of a cell size constraint or the like, so that a fall time of an output waveform to a low level becomes slow. Further, if the μp/μn ratio is increased by reducing the size of the NMOS transistor, sensitivity to manufacturing variations is increased, as a result of which, an operation margin will be also extremely deteriorated.

In Japanese Patent Kokai Publication JP-A-8-321768, a buffer circuit is disclosed that enabled a high-speed operation. In this buffer circuit, a charging circuit composed of a pMIS transistor and a discharging circuit composed of an nMIS transistor are connected in series. An output of a rising-edge detection circuit for detecting a rising edge of an input signal is supplied to a gate of the pMIS transistor, while the output of a falling-edge circuit for detecting a falling edge of the input signal is supplied to the gate of the nMIS transistor. The output of a non-inverting gate for receiving the input signal is connected to the connection node between the pMIS transistor and the nMIS transistor. While one of the pMIS transistor and the nMIS transistor is turned on, the other is turned off, so that a short-circuit current does not flow through the nMIS and pMIS transistors, thereby enabling the high-speed operation. In the buffer circuit in the above-mentioned publication, the edge detection circuits are inserted between an input terminal and the gate of the pMIS transistor and between the input terminal and the gate of the nMIS transistor. Both rise and fall transitions of an output signal are delayed by times corresponding to respective propagation delays of the edge detection circuits and hence the circuit is unsuitable as a high-speed buffer circuit. In other words, in the buffer circuit described in the above-mentioned publication, in case wherein a clock synchronous circuit such as a latch or a register samples data by using only one of a rising edge and a falling edge of a clock signal, the clock signal edge used is delayed as with the clock signal edge not used.

SUMMARY OF THE DISCLOSURE

If a propagation delay time of each buffer circuit, inserted in a clock path for delay adjustment, is long and a plurality of buffer circuits are inserted from a clock source to a clock destination, the delays caused by the buffer circuits greatly affect the operation timing of a clock synchronous circuit, such as a latch or register, which is the destination of clock signal. In a CMOS circuit driven with an operating frequency exceeding 100 MHz, for example, one clock cycle (tCK) is less than 10 nanoseconds. As shown in FIG. 12, four buffers for delay adjustment are inserted into each clock tree. If the propagation delay time per buffer is assumed to be roughly 600 ps (pico-seconds), 2.4 ns (nano-seconds) of time is spent by the buffers in delay adjustment and hence a sufficient timing margin in a latch, register or the like, which is the destination of the clock signal, may not be left.

As described above, in order to ensure sufficient setup and hold times and operation of a latch or a register that operates in response to a clock, it is preferable that a delay time of the buffer circuit used for delay adjustment is short.

Accordingly, it is an object of the present invention to provide a buffer circuit for reducing a delay time thereof and a semiconductor integrated circuit that uses the buffer circuit.

The above and other objects are attained by a buffer circuit in accordance with an aspect of the present invention, which has an input terminal for receiving an input signal and an output terminal for outputting an output signal, and which comprises:

a first transistor and a second transistor, connected in series between a first power supply and a second power supply having different power supply voltages, being controlled to be on and off based on signals fed to control terminals thereof, a connection node between said first transistor and said second transistor being connected to said output terminal of said buffer circuit, said control terminal of said first transistor being connected to said input terminal of said buffer circuit; and a control circuit having at least an input terminal for receiving the input signal supplied to said input terminal of said buffer circuit, and an output terminal for outputting the signal to be supplied to said control terminal of said second transistor, said control circuit performing control so that when the input signal is at a second logic level corresponding to the voltage of said second power supply, said second transistor is turned off, when the input signal changes from the second logic level to a first logic level corresponding to the voltage of said first power supply, said second transistor is turned on to cause a voltage of an output signal of said output terminal of said buffer circuit to change to the voltage of said second power supply, thereafter, before the input signal undergoes a transition from the first logic level to the second logic level, said second transistor is set to be off, and when the input signal undergoes a transition from the first logic level to the second logic level and said first transistor is switched from off to on, said second transistor is kept off.

In the present invention, when a difference voltage between the voltage of the signal supplied to the control terminal of the first transistor and the voltage of the first power supply has exceeded the threshold voltage of the first transistor during transition of the input signal supplied to the control terminal of the first transistor from the first logic level to the second logic level, the first transistor is turned on with the second transistor kept off, and transition of the output signal voltage of the output terminal of the buffer circuit to the voltage of the first power supply is started.

In the present invention, the control circuit includes a logic circuit for generating the signal to be supplied to the control terminal of the second transistor based on the result of a logical operation on the input signal supplied to the input terminal of the buffer circuit and the output signal outputted from the output terminal of the buffer circuit; and the logic circuit is configured to generate the signal at a logic level for turning on the second transistor and supply the signal to the control terminal of the second transistor when the input signal supplied to the input terminal of the buffer circuit is at the first logic level and the output signal outputted from the output terminal of the buffer circuit is at the first logic level, and then to generate the signal at a logic level for turning off the second transistor and supply the signal to the control terminal of the second transistor when the second transistor is then turned on and the output signal outputted from the output terminal of the buffer circuit becomes the second logic level.

The present invention includes:
a flip-flop circuit with an input terminal thereof connected to the output terminal of the buffer circuit, for storing and holding the logic level of the output signal of the buffer circuit and outputting a signal storing and holding the logic level from an output terminal thereof;
wherein the output terminal of the flip-flop circuit is connected to the output terminal of the buffer circuit.

In the present invention, the control circuit comprises:
an inverter having an input terminal for receiving the input signal supplied to the input terminal of the buffer circuit and an output terminal for outputting the inverted signal of the input signal; and a logic circuit for receiving at two input terminals thereof a signal at a logic level inverted from the logic level of the output signal of the output terminal of the buffer circuit and stored and held in the flip-flop circuit and the output signal from the inverter and outputting the signal at the logic level for turning on the second transistor to the control terminal of the second transistor from an output terminal thereof when the signals received at the two input terminals are both at the second logic level.

In other aspect of the present invention, it may also be so configured that the control circuit receives a selection control signal for controlling activation and deactivation of the buffer circuit and includes means for outputting the signal at a logic level for turning off the second transistor when the selection control signal indicates a value commanding deactivation of the buffer circuit, thereby allowing control over activation and deactivation of the buffer circuit. As clear from descriptions given below, the above-mentioned object is likewise achieved by the inventions defined in the claims as well.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
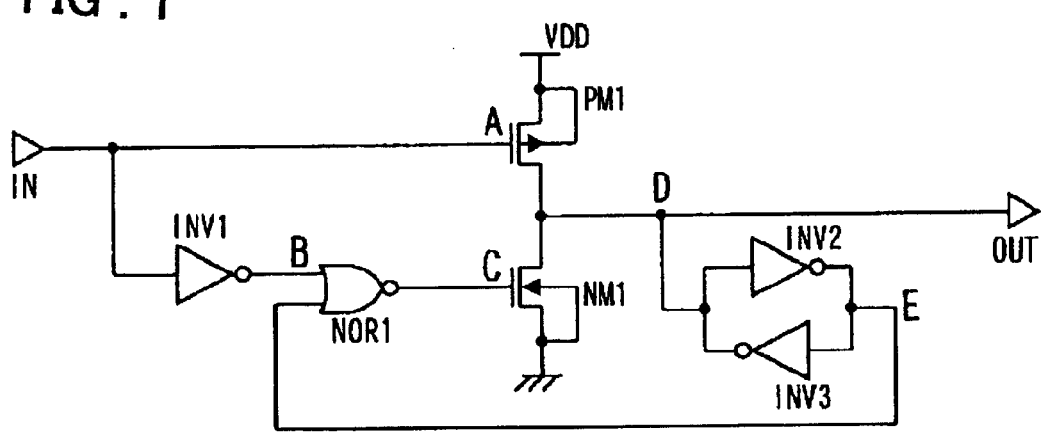
FIG. 1 is a block diagram showing a configuration of a first embodiment of the present invention.

Preferred embodiments of the present invention will be described below. A buffer circuit according to an embodiment of the present invention includes first and second transistors (PM1 and NM1) connected in series between a first power supply that is a high-potential power supply (VDD) and a second power supply that is a low-potential power supply (VSS), and a connection node between the first transistor and the second transistor is an output terminal (OUT) of the buffer circuit. A control terminal of the first transistor (PM1) is connected to an input terminal (IN) of the buffer circuit. The first transistor is turned off when a signal supplied to the input terminal (IN) is at a first logic level (high) which corresponds to a first power supply voltage (VDD), and is turned on when the signal is at a second logic level (low) which corresponds to a second power supply voltage (VSS). The first transistor (PM1) is turned on when a difference voltage (=|VIN−VDD|) between a voltage (VIN) of the signal supplied to a control terminal thereof and the first power supply voltage (VDD) exceeds a threshold voltage |Vtp| of the first transistor (PM1), and causes an output signal voltage of the output terminal (OUT) of the buffer circuit to undergo a transition to the first power supply voltage (VDD).

One of main features of the present invention is that the invention includes a control circuit for performing control so that when an input signal supplied to the input terminal (IN) of the buffer circuit has changed from the first logic level to the second logic level and then the first transistor (PM1) having a control terminal for receiving the input signal is switched from off to on, the second transistor (NM1) is kept off.

More specifically, the control circuit receives the input signal supplied to the input terminal (IN) of the buffer circuit and outputs a signal to be supplied to the control terminal of the second transistor (NM1). The control circuit performs control so that when the input signal is at the second logic level (low), the control circuit supplies the signal at a logic level for turning off the second transistor (NM1) to the control terminal of the second transistor (NM1), and when the input signal is at the first logic level (high), the control circuit supplies to the control terminal of the second transistor (NM1) the signal for turning on the second transistor (NM1) to cause the voltage of the output terminal (OUT) of the buffer circuit to undergo a transition to the second power supply voltage (VSS) and then setting the second transistor (NM1) to be off before the input signal undergoes a transition from the first logic level to the second logic level.

In the embodiment of the present invention having an above configuration, at a time point when the voltage (VIN of the input signal supplied to the input terminal (IN) of the buffer circuit changes from the first supply voltage (VDD) to VDD−|Vtp| or lower and the first transistor (PM1) is switched from off to on, the second transistor (NM1) is kept off. Thus, even when the first transistor (PM1) has been turned on, no short-circuit current flows from the first power supply (VDD) to the second power supply (VSS). Then, in this state, charging of the output terminal (OUT) by a drain current of the first transistor (PM1) is started. With this arrangement, a propagation delay time tpLH from a fall (transition from a high level to a low level) of the input signal to a rise (transition from the low level to the high level) of the output signal of the buffer circuit is reduced more than in a buffer circuit of a ordinary CMOS inverter configuration composed of the first transistor (PM1) and the second transistor (NM1).

Further, in this embodiment, as an input load (a gate capacitance) seen from the input terminal (IN) of the buffer circuit, only the input load (gate capacitance) on the control terminal of the first transistor (PM1) can substantially be seen. In other words, in the control circuit for generating the signal for controlling on/off of the second transistor (NM1), the input load (gate capacitance) on a circuit for receiving the input signal supplied to the input terminal (IN) of the buffer circuit, (such as an inverter INV1 in FIG. 1), is considerably smaller than the input load on the control terminal of the first transistor (PM1). For this reason, a fall time of the input signal applied to the input terminal (IN) of the buffer circuit is also reduced, consequently contributing to a reduction in the propagation delay time tpLH of the buffer circuit.

Generally, in a buffer circuit for driving a heavy load, in order to have a high current-driving capability, a gate width (W) of an output transistor is set to be large. For this reason, the input load (gate capacitance) of the buffer circuit becomes large. When the gates of the PMOS transistor and the NMOS transistor are commonly connected to the input terminal (IN) of the buffer circuit, as in an ordinary CMOS inverter configuration, the gate capacitances of the two transistors are connected in parallel, as seen from the input terminal (IN), so that the input load capacitance is nearly doubled, compared with a case in the present embodiment.

In the present embodiment, the second transistor (NM1) is turned on when the input signal from the input terminal (IN) of the buffer circuit has changed from the second logic level (low) to the first logic level (high). When the input signal supplied to the input terminal (IN) of the buffer circuit is at the second logic level, the first transistor (PM1) is in an on state. When the input signal has changed from the second logic level (low) to the first logic level (high), the first logic level (high) is supplied to the control terminal of the second transistor (NM1), being delayed with a delay time of the control circuit for controlling on/off of the second transistor (NM1), and then the second transistor (NM1) is turned on. At this time, the first logic level (high) is supplied to the control terminal of the first transistor (PM1) from the input terminal (IN) of the buffer circuit, so that the first transistor (PM1) is kept off. Thus, when the second transistor (NM1) is switched from off to on, the short-circuit current does not flow from the first power supply (VDD) to the second power supply (VSS), thereby achieving a reduction in power consumption. Further, when the second transistor (NM1) is turned on, the short-circuit current does not flow. Thus, a speed up of a fall time of the output signal from the output terminal in the buffer circuit is achieved.

In this embodiment, a propagation delay time tpHL, which is a delay time from a rise transition of the input signal supplied to the input terminal (IN) of the buffer circuit to a fall transition of the signal of the output terminal (OUT) of the buffer circuit, is not reduced, as distinct from the above-mentioned tpLH which is a propagation delay time from a fall transition of the input signal to a rise transition of the signal of the output terminal (OUT) of the buffer circuit, and which is reduced by speeding up a start of the transition. In other words, the signal of the output terminal (OUT) of the buffer circuit falls from the first logic level (high) to the second logic level (low), being delayed by a delay time during which the input signal passes through the control circuit.

When the input signal supplied to the input terminal (IN) of the buffer circuit has changed from the second logic level (low) to the first logic level (high), the first transistor (PM1) is switched off, and the second transistor (NM1) is turned on once, being delayed by the delay time of the control circuit. A signal voltage of the output terminal (OUT) is changed to the second logic level corresponding to the second power supply voltage (VSS) from the first power supply voltage (VDD). Thereafter, the second logic level (low) is supplied to the control terminal of the second transistor (NM1), so that the first and second transistors both are turned off. The output terminal of the buffer circuit thus is in a high-impedance state.

At this time, a flip-flop circuit, which is connected to the output terminal (OUT) of the buffer circuit and is composed of two inverters (INV2 and INV3), with input terminals thereof being connected to an output terminal of others, stores and holds the logic level of the output terminal (OUT) of the buffer circuit, immediately before the output terminal (OUT) of the buffer circuit is set in the high-impedance state. The output terminal (OUT) of the buffer circuit in the high-impedance state is set to the logic level outputted from the inverter (INV3) at a flip-flop output stage. That is, when the input signal supplied to the input terminal (IN) of the buffer circuit has changed from the second logic level (low) to the first logic level (high), the second transistor (NM1) is turned on once. Then, even if the second transistor (NM1) is turned off during a time before a change of the input signal from the first logic level (high) to the second logic level (low), the voltage of the output terminal (OUT) of the buffer circuit is pulled up or pulled down to the original logic level via the output terminal of the inverter (INV3) which composes the flip-flop output stage. In other words, in this embodiment, even if the output terminal of the buffer circuit is kept in the high-impedance state, its output voltage is avoided from remaining at a voltage intermediate between the first logic level (high: VOH) and the second logic level (low: VOL) or being set to a logic level different from the original logic level.

As another embodiment of the present invention, in the buffer circuit according to the above-mentioned embodiment, the first power supply may be replaced with the low-potential power supply (VSS), the second power supply may be replaced with the high-potential power supply (VDD), and thus the first logic level corresponding to the first power supply voltage and the second logic level corresponding to the second power supply voltage may be changed to low and high, respectively. In this another embodiment, of the two transistors (PM1 and NM1) connected in series between the first power supply (VSS) and the second power supply (VDD), the transistor over which on/off switching control is performed by the control circuit is replaced with the transistor (PM1), and the propagation delay time tpHL from a rise transition of an input signal supplied to the input terminal (IN) of the buffer circuit to a fall transition of an output signal of the output terminal (OUT) of the buffer circuit is reduced. That is, in this another embodiment, the first transistor having a control terminal directly connected to the input terminal (IN) of the buffer circuit is the NM1 in FIG. 1, while the second transistor which is controlled to be on and off by a signal supplied to its control terminal from the control circuit is the PM1 in FIG. 5, the transistors being interchanged as compared with those in the before-mentioned embodiment described with reference to FIG. 1. Another embodiment of the present invention will be described below with reference to FIG. 5.

More specifically, another embodiment includes the first and second transistors (NM1 and PM1) connected in series between the first power supply (VSS) and the second power supply (VDD), and the connection node between an output of the first transistor and the output of the second transistor is the output terminal (OUT) of the buffer circuit. The control terminal of the first transistor (NM1) is connected to the input terminal (IN) of the buffer circuit. When the difference voltage VIN–VSS between the voltage (VIN) of a signal supplied to the control terminal of the first transistor (NM1) and the first power supply voltage (VSS) exceeds a threshold voltage (Vtn) of the first transistor (NM1), the first transistor (NM1) is turned on to cause the output terminal (OUT) of the buffer circuit to undergo a transition to the first power supply voltage (VSS). One of the main features of the another embodiment of the present invention is that this embodiment has a control circuit for performing control so that when the first transistor (NM1) is switched from off to on, the second transistor (PM1) is kept off.

This control circuit comprises a circuit for receiving the input signal supplied to the input terminal (IN) of the buffer circuit and for outputting a signal to be supplied to the control terminal of the second transistor (PM1). When the input signal is at the second logic level (high) corresponding to the second power supply voltage (VDD), the control circuit supplies the signal for turning off the second transistor (PM1) to the control terminal of the second transistor (PM1). The control circuit sets the signal to be supplied to the control terminal of the second transistor (PM1) so that when the input signal is at the first logic level (low) corresponding to the first power supply voltage (VSS), the second transistor (PM1) is turned on to cause the voltage of the output terminal (OUT) of the buffer circuit to undergo a transition to the second power supply voltage (VDD) and then the second transistor (PM1) is turned off.

In another embodiment of the present invention, when the input signal supplied to the input terminal (IN) of the buffer circuit has changed from the first logic level (low) to the second logic level (high) and then the first transistor (NM1) is switched from off to on, the second transistor (PM1) is kept off. Thus, even when the first transistor (NM1) is turned on, no short-circuit current from the power supply (VDD) to the power supply (VSS) flows, and the output terminal (OUT) is discharged through the first transistor (NM1) in the on state. Thus, the propagation delay time tpHL from a rise of the input signal (transition to the high level) to a fall of the output signal of the buffer circuit (transition to the low level) is reduced.

Further, in this another embodiment, as the input load seen from the input terminal, only the input load (gate capacitance load) on the control terminal of the first transistor (NM1) is seen. Thus, the fall time of the input signal to the input terminal (IN) of the buffer circuit is also reduced, thus contributing to a reduction in the propagation delay time tpHL of the buffer circuit. In this embodiment, the second transistor (PM1) is turned on when the input signal from the input terminal (IN) of the buffer circuit has changed from the second logic level (high) to the first logic level (low). When the input signal from the input terminal (IN) of the buffer circuit is at the second logic level (high), the first transistor (NM1) is in the on state. When the input signal changes from the second logic level (high) to the first logic level (low), the first logic level (low) is supplied to the signal for controlling the second transistor (PM1), being delayed by the delay time of the control circuit for controlling on/off of the second transistor (PM1), and then the second transistor (PM1) is turned on. At this time, the first logic level (low) is supplied to the control terminal of the first transistor (NM1) from the input terminal (IN) of the buffer circuit, so that the first transistor (NM1) is kept off. Thus, when the second transistor (PM1) is switched from off to on, the short-circuit current does not flow from the power supply (VDD) to the power supply (VSS) and hence the power consumption is reduced.

In this another embodiment, in response to transition of the input signal supplied to the input terminal (IN) of the buffer circuit from the second logic level (high) to the first logic level (low), the second transistor (PM1) is turned on, being delayed by the delay time of the control circuit, so that the signal of the output terminal (OUT) of the buffer circuit changes from the first logic level (low) to the second logic level (high). When the input signal changes from the second logic level (high) to the first logic level (low), the first transistor (NM1) is turned off, while the second transistor (PM1) is turned on. Thus, the output terminal (OUT) is changed from the first logic level to the second logic level. Thereafter, before the input signal undergoes a transition from the first logic level (low) to the second logic level (high), the second logic level (high) is supplied to the control terminal of the second transistor (PM1) from the control circuit. Thus, the first and second transistors (NM1 and PM1) both become the off state, so that the output terminal of the buffer circuit becomes the high-impedance state. At this point, the flip-flop circuit (inverters INV2 and INV3 with their input terminals and output terminals interconnected) connected to the output terminal of the buffer circuit holds and outputs the logic level of the output terminal of the buffer circuit immediately before the output terminal of the buffer circuit becomes the high-impedance state. The output terminal of the buffer circuit in the high-impedance state is set to a voltage corresponding to the original logic level of the buffer circuit to be outputted, by the output of the flip-flop (output of the inverter INV3).

In other embodiment of the present invention, a control circuit includes the inverter (INV1) with an input terminal for receiving an input signal supplied to the input terminal of a buffer circuit and an output terminal for outputting an inverted signal of the input signal. The control circuit receives the output of the inverter (INV2) constituting the flip-flop circuit, the output of the inverter (INV1), and a selection control signal or its inverted signal for controlling activation and deactivation of the buffer circuit at its three input terminals. The control circuit includes a logic circuit (NOR3). When the selection control signal indicates a value for commanding activation of the buffer circuit and the signals input to the three input terminals are all at the second logic level, the logic circuit (NOR3) outputs a signal at a logic level for turning on the second transistor (NM1) to the control terminal of the second transistor from its output terminal. When the selection control signal commands deactivation of the buffer circuit, the logic circuit (NOR3) outputs the signal at a logic level for turning off the second transistor to the control terminal of the second transistor from its output terminal, irrespective of the values of other two input signals. The present invention with an above-mentioned configuration can control supply and stop of a clock, while maintaining high-speed supply of a high level output. The buffer circuits in the embodiments described above may of course also be combined for use as a configuration of the present invention.

In order to describe the above-mentioned embodiments of the present invention in further detail, embodiments of the present invention will be described below with reference to drawings. FIG. 1 is a block diagram showing a configuration of a buffer circuit according to an embodiment of the present invention. Referring to FIG. 1, the buffer circuit in this embodiment is formed by using a CMOS process. This circuit is an inverting buffer circuit that receives an input signal supplied to an input terminal IN and outputs an inverted signal of the input signal from an output terminal OUT. The circuit includes a p-channel MOS transistor (referred to as a "PMOS transistor") PM1 with its source connected to a high-potential power supply VDD and an N-channel MOS transistor (referred to as an "NMOS transistor") NM1 with its source connected to a low-potential power supply VSS, and a connecting node between a drain of the PMOS transistor PM1 and the drain of the NMOS transistor NM1 is the output terminal OUT of the buffer circuit.

A gate of the PMOS transistor PM1 is connected to the input terminal IN of the buffer circuit. When the input signal supplied to the input terminal IN is at a high level, the PMOS transistor PM1 is turned off. When an input signal voltage falls to be equal to or less than a value which is obtained by subtracting an absolute value |Vtp| for a threshold voltage from a power supply voltage VDD, or VDD−|Vtp|, the PMOS transistor PM1 is turned on. Then, the PMOS transistor PM1 charges the output terminal OUT through the power supplies VDD, and causes the output terminal OUT to undergo a transition to the power supply voltage VDD. In other words, the output signal rises from a low level to a high level.

An inverter INV1 and an NOR circuit NOR1 which receives an output of the inverter INV1 at one of input terminals are inserted between the input terminal IN of the buffer circuit and the gate of the NMOS transistor NM1. The inverter INV1 and NOR circuit NOR1 compose a control circuit for generating and outputting a signal to be supplied to the gate of the NMOS transistor NM1.

When the input signal supplied to the input terminal IN is at a low level, the control circuit causes the NMOS transistor NM1 to be in an off state. When the input signal undergoes a transition to a high level, the control circuit causes the NMOS transistor to be turned on, causes electric charge at the output terminal OUT to be discharged to a side of the power supply voltage VSS, and then causes a voltage of the output terminal OUT to undergo a transition to the power supply voltage VSS. Thereafter, before the input signal falls from high to low, the control circuit sets the gate of the NMOS transistor NM1 to a low level. With this arrangement, at a time when the input signal undergoes a transition from a high level to a low level and the PMOS transistor PM1 is switched from off to on, the NMOS transistor NM1 is kept off.

In the present embodiment, when the PMOS transistor PM1 is switched from off to on, at a fall transition of the input signal, no short-circuit current from the power supply VDD to the power supply VSS flows.

Referring to FIG. 1, a connection point between the drain of the PMOS transistor PM1 and the drain of the NMOS transistor NM1 is connected to the output terminal OUT of the buffer circuit, and is also connected to the input terminal of an inverter INV2 and the output terminal of an inverter INV3. The output terminal of the inverter INV2 is connected to the input terminal of the inverter INV3. The inverters INV2 and INV3 compose a flip-flop, which stores and holds a logic value for the output terminal OUT of the buffer circuit.

Then, the output terminal of the inverter INV1, the input terminal of which is connected to the input terminal IN and the output terminal of the inverter INV2 are connected to the input terminals of the two-input NOR circuit NOR1. The output terminal of the NOR circuit NOR1 is connected to the gate of the NMOS transistor NM1.

Figure 2:
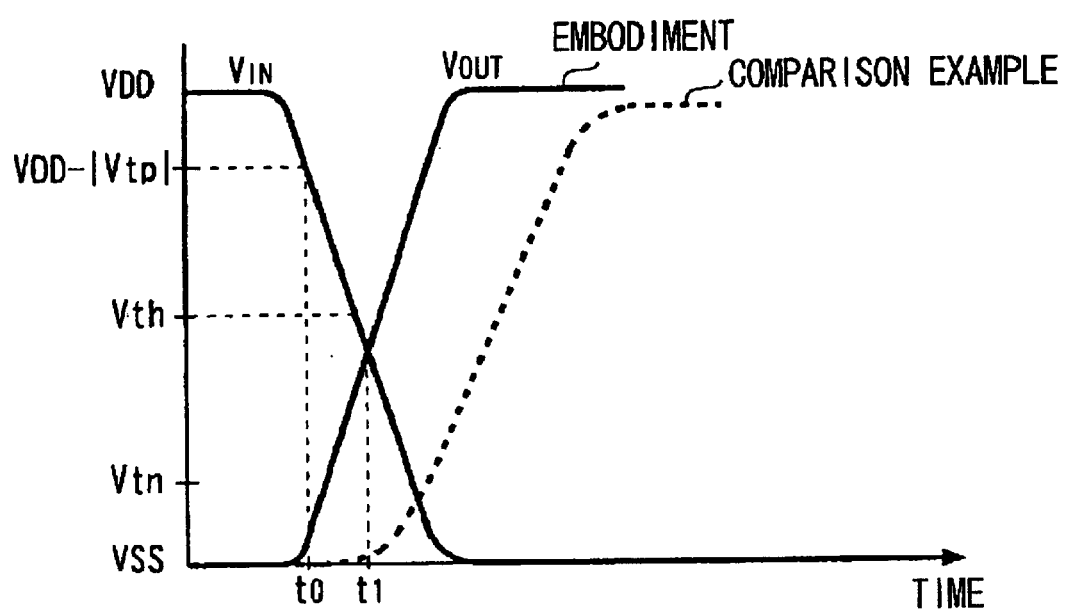
FIG. 2 is a waveform diagram for explaining input and output operations of the first embodiment of the present invention.

FIG. 2 is a waveform diagram showing an operation of a first embodiment of the present invention. Referring to FIG. 2, at a time point (t0) when an input signal voltage VIN of the input terminal IN has become equal to or lower than VDD−|Vtp|, where the Vtp is the threshold voltage of the PMOS transistor PM1, an output signal voltage VOUT of the output terminal OUT begins to rise.

On contrast therewith, in a CMOS inverter (for a comparison example), composed of a PMOS transistor and an NMOS transistor connected in series between the power supplies VDD and VSS, which commonly receive the input signal at their gates and in which a connection point between their drains is connected to the output terminal, when the input signal voltage VIN undergoes a transition to be equal to or lower than VDD−|Vtp|, the PMOS transistor is turned on and the NMOS transistor, however, is also in an on state. Accordingly, the short-circuit current flows from the power supply VDD to the power supply VSS through the PMOS transistor and NMOS transistor that are in the on state. When the input signal voltage becomes lower than Vtn, where Vtn is the threshold voltage of the NMOS transistor, the NMOS transistor is turned off. Thus, the short-circuit current flows from the power supply VDD to the power supply VSS during a period in which the input signal voltage is in the range between the VDD−|Vtp| and Vtn. Accordingly, in the comparison example, when the input signal to the CMOS inverter changes from a high level to a low level, a start time of a rise of the output signal is delayed, as shown in a dotted line (in the comparison example) in FIG. 2, from the embodiment of the present invention.

As described above, in the present invention, a propagation delay time tpLH from high to low transition of the input signal to low to high transition of the output signal is made more reduced than that of the CMOS inverter.

In the CMOS inverter, it is necessary to drive parallel gate load capacitances of the PMOS transistor and the NMOS transistor. On contrast therewith, in the present invention, as a gate load seen from the input terminal IN, there is only a gate capacitance of the PMOS transistor in the buffer circuit. That is, the inverter INV1 may be the one just for generating a signal for supply to the NOR1, and does not drive a load such as a clock interconnection, as being distinct from the PMOS transistor PM1 and the NMOS transistor NM1. Thus, a device size of the inverter INV1 can be made smaller than the PMOS transistor and hence, as the gate load seen from the input terminal IN, only the gate capacitance of the PMOS transistor in the buffer circuit is seen, which contributes to high-speed transition of the input signal.

Figure 3:
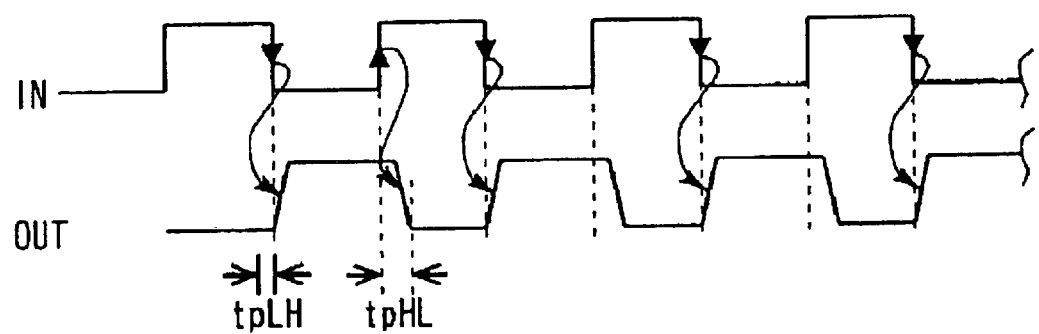
FIG. 3 is a timing chart of an input signal and an output signal for explaining an overview of the first embodiment of the present invention.

FIG. 3 is a timing chart schematically showing an example of an input signal to the input terminal (IN) and an output signal from the output terminal (OUT) in the buffer circuit in the first embodiment of the present invention. As shown in FIG. 3, in this embodiment, the propagation delay time tpLH from a fall of the input signal supplied to the input terminal (IN) of the buffer circuit to a rise of the output signal of the output terminal (OUT) of the buffer circuit is reduced more than in an ordinary CMOS inverter. In this embodiment, a propagation delay time tpHL from a rise of the input signal to a fall of the output signal is behind that of the ordinary CMOS inverter by a delay time specified by the propagation delays of the inverter INV1 and the NOR circuit NOR1 in FIG. 1.

Figure 4:
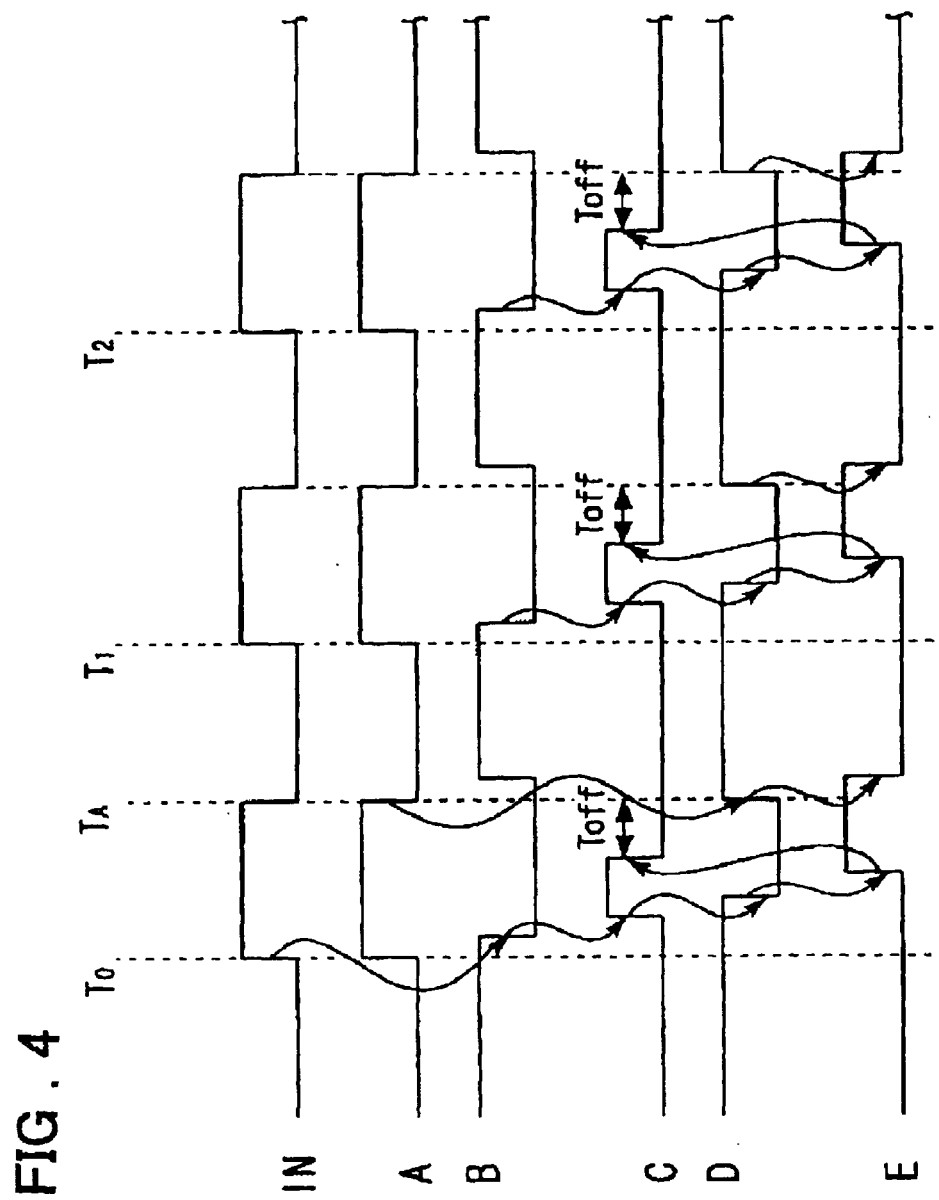
FIG. 4 is a timing chart for explaining an operation of the first embodiment of the present invention.

FIG. 4 is a timing chart for explaining an operation of the buffer circuit in the first embodiment of the present invention shown in FIG. 1. Referring to FIG. 4, IN denotes a signal waveform at the input terminal, A denotes a signal waveform at a node for the gate of the PMOS transistor PM1, B denotes a signal waveform at the node for the output of the inverter INV1 (a first input to the NOR1), C denotes a signal waveform at the node for the gate of the NMOS transistor NM1, D denotes a signal waveform at the node for the connection point between the drains of the PMOS transistor PM1 and the NMOS transistor NM1, and E denotes a signal waveform at the node for the output of the inverter INV2 (a second input to the NOR1), in FIG. 1.

When the input signal IN rises (at a timing $T_0$ in FIG. 4), the node B falls to a low level, with a delay by the delay time of the inverter INV1. At this time, the node D is at a high level and the node E is at a low level. Thus, the node C for the output of the NOR circuit NOR1 undergoes a transition from a low level to a high level. In response to a rise of the node C, the NMOS transistor NM1 that receives the voltage at the node C as a gate voltage is switched from off to on, and discharges electric charge at the node D to the VSS side to cause the node D to undergo a transition to a low level. When the NMOS transistor NM1 is switched on from off, a high level is applied to the node A or the gate of the PMOS transistor PM1, so that the PMOS transistor PM1 is in the off state. Thus, the short-circuit current from the power supply VDD to the power supply VSS does not flow.

When the node D falls to a low level, the node E, which is the output node of the inverter INV2, goes to a high level and the node C, which is the output node of the NOR circuit NOR1 which receives a voltage of node E, goes to a low level.

When the node C goes to a low level, the NMOS transistor NM1, which receives the voltage at the node C as the gate voltage is turned off. During this period as well, the input signal are high, and the PMOS transistor PM1 is in the off state. The PMOS transistor PM1 is in the off state until the input signal IN undergoes a transition from high to low. During a period indicated by $T_{off}$ (the period from a fall timing of the node C to a fall timing of the input signal IN), the output terminal OUT in the buffer circuit is made in a high-impedance state.

The flip-flop composed of the inverters INV2 and INV3 stores and holds the logic value for the node D (logic value before the high-impedance state). During the period ($T_{off}$) where the output terminal OUT of the buffer circuit is in the high-impedance state, the inverter INV3, the output terminal of which is at a low level, discharges the output terminal OUT of the buffer circuit, and functions to cause the output terminal OUT of the buffer circuit to be at a low level. The inverter V3 is composed of a CMOS inverter, and preferably, the size of a NMOS transistor of the CMOS inverter is smaller than that of the NMOS transistor NM1 composing the buffer circuit. During the period ($T_{off}$) where both of the PMOS transistor PM1 and the NMOS transistor NM1 in the buffer circuit are in an off state, if the output signal voltage of the output terminal (OUT) is at a low level (of a VOL or lower, or close to the VOL) and does not reach the power supply voltage VSS yet, the inverter INV3 that outputs the low level causes the output signal voltage of the output terminal (OUT) to fall to the power supply voltage VSS.

When the input signal IN falls at a timing $T_A$ in FIG. 4, the PMOS transistor PM1 which is switched from off to on starts charging the output terminal OUT (node D) through the power supply VDD, and a transition of the output terminal OUT (node D) to a high level is immediately started, as described with reference to FIG. 2. The node E at this time changes to a low level, the node B is set to a high level, and the node C which is the output node of the NOR circuit NOR1 is kept at a low level. That is, the NMOS transistor NM1 is kept off.

Incidentally, in FIG. 4, a transition timing of a clock signal supplied to the input terminal (IN) of the buffer circuit from a high level to a low level between timings $T_0$ and $T_1$ is indicated by $T_A$, and a duty ratio of the clock signal supplied to the input terminal (IN) of the buffer circuit is set to 1:1 (50%), for simplicity. In this embodiment, the duty ratio of the clock signal may, of course, be other than 1:1. In FIG. 4, a period from the timing $T_0$ to the timing $T_1$ constitutes one clock cycle (tCK).

Figure 5:
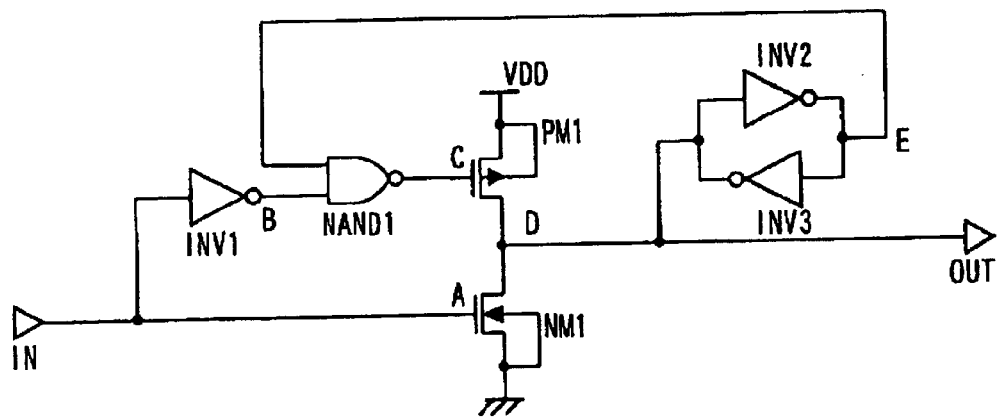
FIG. 5 is a block diagram showing a configuration of a second embodiment of the present invention.
Figure 6:
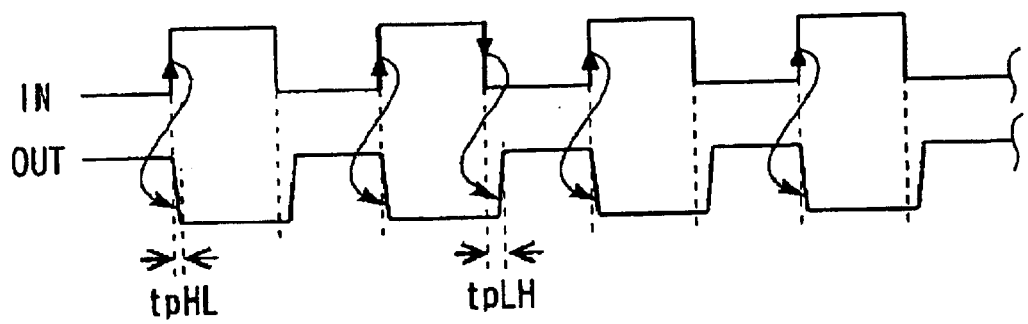
FIG. 6 is a timing chart of the input signal and the output signal for explaining an overview of the second embodiment of the present invention.

Next, a second embodiment of the present invention will be described. FIG. 5 is a block diagram showing a configuration of the second embodiment of the present invention. Referring to FIG. 5, this embodiment is obtained by interchanging polarities of the transistors where the signals input to the gates are controlled, as compared with those in the before-mentioned embodiment. In the present embodiment, the input signal fed to the input terminal IN is fed to the gate of the NMOS transistor NM, while the output signal of a control circuit constituted from the inverter INV1 and a NAND circuit NAND1 is fed to the gate of the PMOS transistor PM1. In the before-mentioned embodiment, the propagation delay time from a fall of the input signal to a rise of the output signal of the buffer circuit to was reduced. In the present embodiment, the propagation delay time tpHL from a rise of the input signal to a fall of the output signal of the buffer circuit is reduced, as shown in FIG. 6.

More specifically, referring to FIG. 5, the buffer circuit in the present embodiment includes a PMOS transistor PM1, which has a source connected to the high-potential power supply VDD, and a NMOS transistor NM1 which has a source connected to the low-potential power supply VSS. The connection node between the drains of the PMOS transistor PM1 and the NMOS transistor NM1 is the output terminal OUT of the buffer circuit. The gate of the NMOS transistor NM1 is connected to the input terminal IN of the buffer circuit. When the input signal is at a low level, the NMOS transistor NM1 is in an off state. When the input signal voltage rises to exceed the threshold voltage Vtn of the NMOS transistor NM1, the NMOS transistor NM1, which is turned on, discharges the output terminal OUT of the buffer circuit and causes output terminal OUT to undergo a transition to the power supply voltage VSS.

A circuit composed of an inverter INV1 and a NAND circuit NAND1 is inserted between the input terminal IN of the buffer circuit and the gate of the PMOS transistor PM1. The circuit constitutes the control circuit for controlling a timing of a signal to be supplied to the gate of the PMOS transistor PM1.

When the input signal fed to the input terminal IN is at a high level, the control circuit causes the PMOS transistor PM1 to be turned off. When the input signal goes to a low level, the control circuit causes the PMOS transistor PM1 to be turned on to charge the output terminal OUT to the VDD and to set the output terminal OUT to a high level. Thereafter, the control circuit sets the gate of the PMOS transistor PM1 to be at a high level. By doing so, when the input signal undergoes a transition from a low level to a high level, and the NMOS transistor NM1 is switched from off to on, the PMOS transistor PM1 is kept off. With this arrangement, the short-circuit current from the power supply VDD to the power supply VSS through the PMOS transistor PM1 and the NMOS transistor NM1 does not flow when the NMOS transistor NM1 is turned on.

Referring to FIG. 5, the connection point between the drains of the PMOS transistor PM1 and the NMOS transistor NM1 is connected to a flip-flop composed of inverters INV2 and INV3, where an input of one inverter is connected to the output of the other inverter. The output of the inverter INV1 that has an input terminal connected to the input terminal IN and the output terminal of the inverter INV2 are connected to the input terminals of the NAND circuit NAND1. The output terminal of the NAND circuit NAND1 is connected to the gate of the PMOS transistor PM1.

Figure 7:
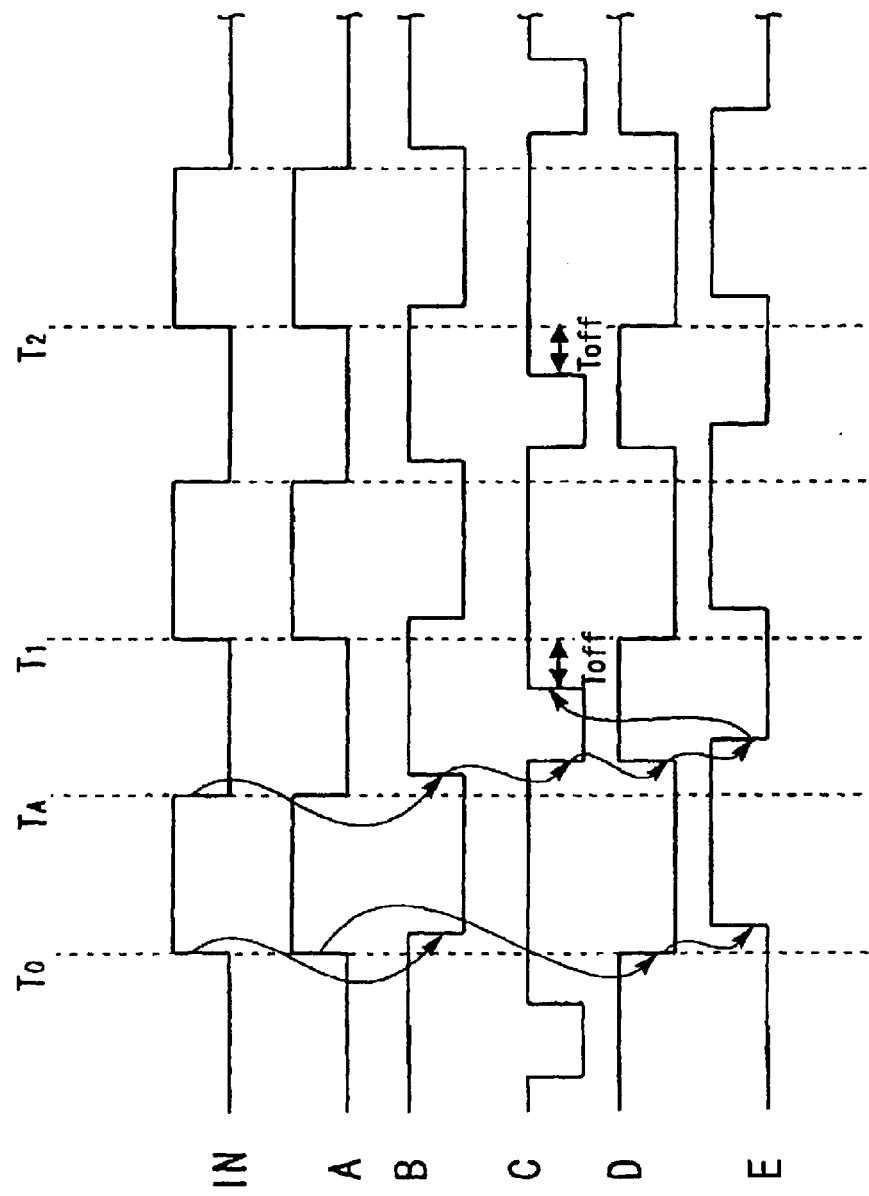
FIG. 7 is a timing chart for explaining an operation of the second embodiment of the present invention.

FIG. 7 is a chart for explaining an operation of the second embodiment of the present invention shown in FIG. 5. Referring to FIG. 7, IN denotes a signal waveform at the input terminal, A denotes the signal waveform at a node for the gate of the NMOS transistor NM1, B denotes a signal waveform at the node for the output of the inverter INV1 (first input to the NAND1), C denotes a signal waveform at the node for the gate of the PMOS transistor PM1, D denotes a signal waveform at the node for the connection point between drains of the PMOS transistor PM1 and the NMOS transistor NM1, and E denotes a signal waveform at the node for the output of the inverter INV2 (second input to the NAND1), in FIG. 5.

When the input signal rises at the timing $T_0$ in FIG. 7, the NMOS transistor NM1 is turned on to make the output terminal OUT (node D) low. At this time, the output node E of the inverter INV2 is at a high level.

When the input signal supplied to the input terminal (IN) of the buffer circuit falls at the timing $T_A$ between the timings $T_0$ and $T_1$, the output of the inverter INV1 changes from a low level to a high level, and two inputs to the NAND circuit NAND 1 (at the nodes B and E) both go to a high level. The node C which is the output node of the NAND circuit NAND1 goes to a low level, the PMOS transistor PM1 is turned on, and the output terminal OUT (node D) goes to a high level. A transition of the output terminal OUT to a high level causes the node E which is the output node of the inverter INV2 to undergo a transition to a low level. In response to the signal voltage (being at a high level) at the node B and the signal voltage (being at a low level) at the node E, the NAND circuit NAND1 causes the output node C to undergo a transition to a high level. The PMOS transistor PM1, to which a gate a high level is applied, is turned off. Since the input signal IN is at a low level at this time, the NMOS transistor NM1 and the PMOS transistor PM1 both are in an off state.

The flip-flop composed of the inverters INV2 and INV3 stores and holds the logic value for the node D (logic level before a high-impedance state). During the period ($T_{off}$) where the output terminal OUT of the buffer circuit is in a high-impedance state, the inverter INV3, the output terminal of which is set to a high level, charges the output terminal OUT of the buffer circuit, and functions to cause the output terminal OUT of the buffer circuit to go to a high level. The inverter V3 is composed of a CMOS inverter, and the size and the current driving capability of its PMOS transistor is made smaller than that of the PMOS transistor PM1 constituting the buffer circuit.

If the output signal voltage of the output terminal OUT) (voltage at the node D) is at a high level(VOH or higher, where the VOH is an output voltage HIGH), but does not reach the power supply voltage VDD yet during the period where both of the PMOS transistor PM1 and the NMOS transistor NM1 in the buffer circuit are in an off state ($T_{off}$ in FIG. 7), the output signal voltage of the output terminal (OUT) is pulled up to the power supply voltage VDD by the inverter INV3 that outputs a high level.

When the input signal IN undergoes a transition to a high level at the timing $T_1$ in FIG. 7, the NMOS transistor NM1 is turned on. At this time, because the high level is applied to the gate of the PMOS transistor PM1, the PMOS transistor PM1 is turned off, so that the output terminal OUT goes to a low level immediately. The duty ratio of the clock signal supplied to the input terminal (IN) of the buffer circuit in FIG. 7 is set to 1:1 (50%), for simplicity. In this embodiment, the duty ratio of the clock signal may, of course, be other than 1:1.

Figure 8:
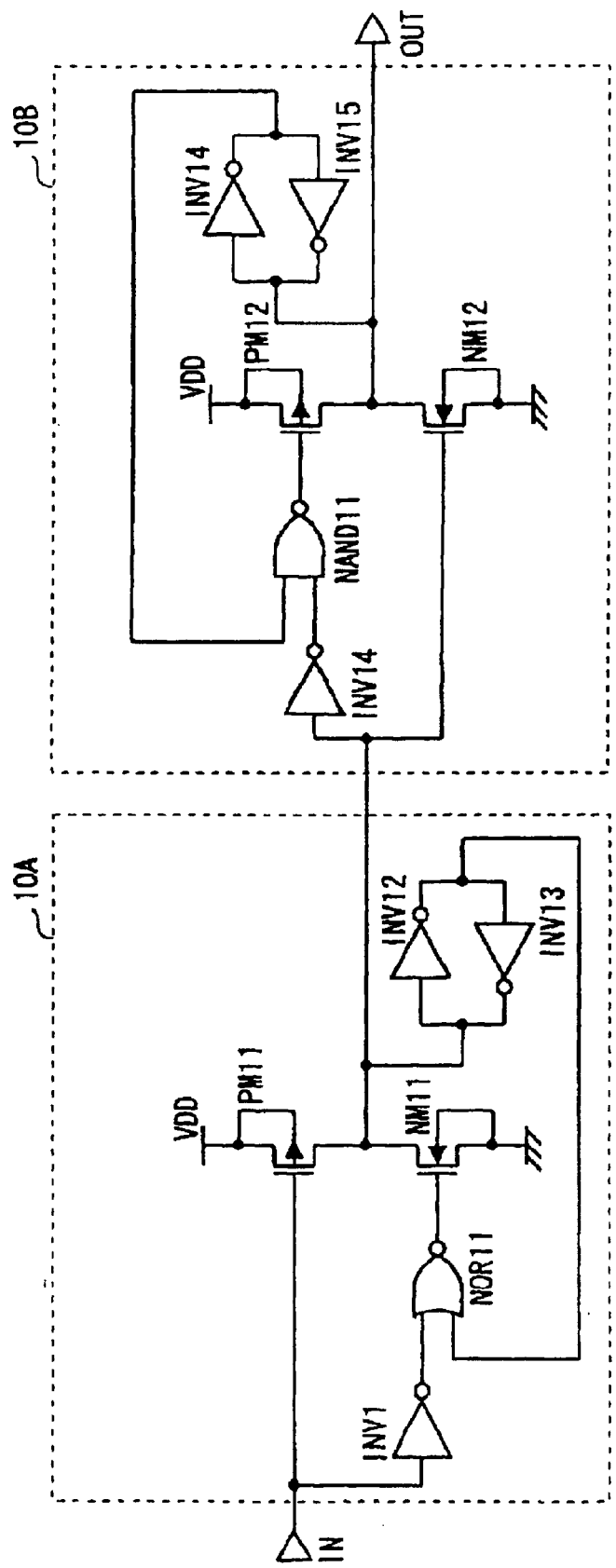
FIG. 8 is a block diagram showing a third embodiment of the present invention.

Next, a third embodiment of the present invention will be described. FIG. 8 is a block diagram showing a configuration of the third embodiment of the present invention. As shown in FIG. 8, a buffer in this embodiment is obtained by cascading an inverting buffer circuit 10A and an inverting buffer circuit 10B and functions as an non-inverting buffer.

The inverting buffer circuit 10A has the same structure as the buffer circuit in the first embodiment, described with reference to FIG. 1, and reduces a delay time from a fall of the input signal fed to the input terminal IN to a rise of the output signal. The inverting buffer circuit 10B has the same structure as the buffer circuit in the second embodiment, described with reference to FIG. 5, and reduces a delay time from a rise of the output signal of the inverting buffer circuit 10A to a fall of the output signal of the output terminal OUT.

With this arrangement, the delay time from a fall of the input signal fed to the input terminal IN to a fall of the output signal of the output terminal OUT is reduced.

When the inverting buffer circuit 10B is disposed in a front stage and the inverting buffer circuit 10A is disposed in a rear stage following the inverting buffer circuit 10B as a variation of this embodiment, the propagation delay time from a rise of the input signal fed to the input terminal IN to a fall of the output signal is reduced by the inverting buffer circuit 10B, and the propagation delay time from a fall of the output signal of the inverting buffer circuit 10B to a rise of the output signal of the output terminal OUT is reduced by the inverting buffer circuit 10A. With this arrangement, the propagation delay time from a rise of the input signal fed to the input terminal IN to a rise of the output signal of the output terminal OUT in the cascaded buffer circuits is reduced.

Figure 9:
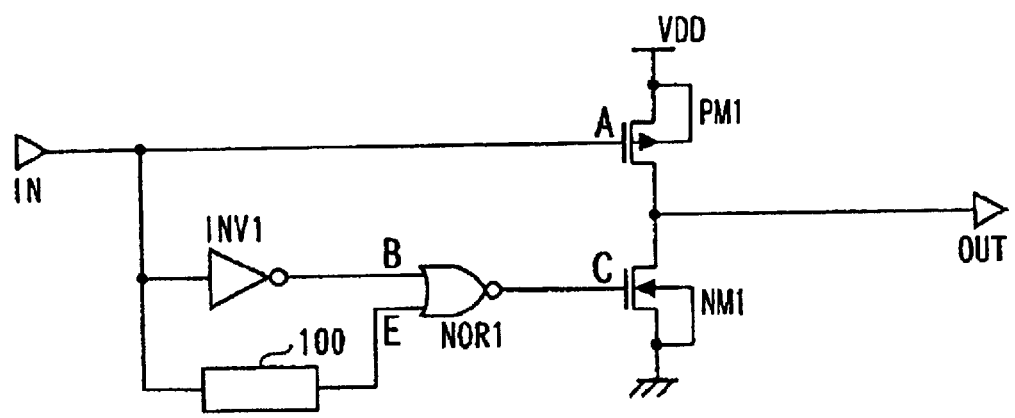
FIG. 9 is a block diagram showing a configuration of a fourth embodiment of the present invention.

Next, a fourth embodiment of the present invention will be described. FIG. 9 is a block diagram showing a configuration of the fourth embodiment of the present invention. In the configurations of the embodiments shown in FIGS. 1 and 5, the flip-flop (composed of the inverters INV2 and INV3) is provided which sets the output terminal OUT of the buffer circuit to a low level or a high level that is the logic level immediately before the logic level of the output terminal OUT during the period $T_{off}$ where the PMOS and NMOS transistors are both in an off state. Thus, the output terminal is thereby controlled to be at a normal logic level when the output terminal OUT of the buffer circuit is in an high-impedance state. However, when the period $T_{off}$ in the timing chart in FIG. 4, for example, where the output terminal OUT of the buffer circuit is in the high-impedance state, is comparatively short, an effect of the present invention can be achieved to a certain degree even if the flip-flop constituted from the inverters INV2 and INV3, shown in FIGS. 1 and 5, is omitted. In other words, if the period $T_{off}$ is short, there is little possibility that an erroneous logic level of the output terminal OUT of the buffer circuit is passed on to a subsequent circuit. In this case, referring to FIG. 9, a gate of a PMOS transistor PM1 is connected to an input terminal IN, and a gate of an NMOS transistor NM1 is connected to an output terminal of a NOR circuit NOR1. The NOR circuit NOR1 receives an output of the inverter INV1 that receives and inverts the input signal fed to the input terminal IN and the output of a delay circuit 100 that receives and delays the input signal fed to the input terminal IN.

In the present embodiment, a rise transition of the signal of the output terminal OUT in the buffer circuit from a low level to a high level during a fall of the input signal fed to the input terminal IN of the buffer circuit from a high level to a low level is the same as a timing waveform shown in FIG. 3.

Figure 10:
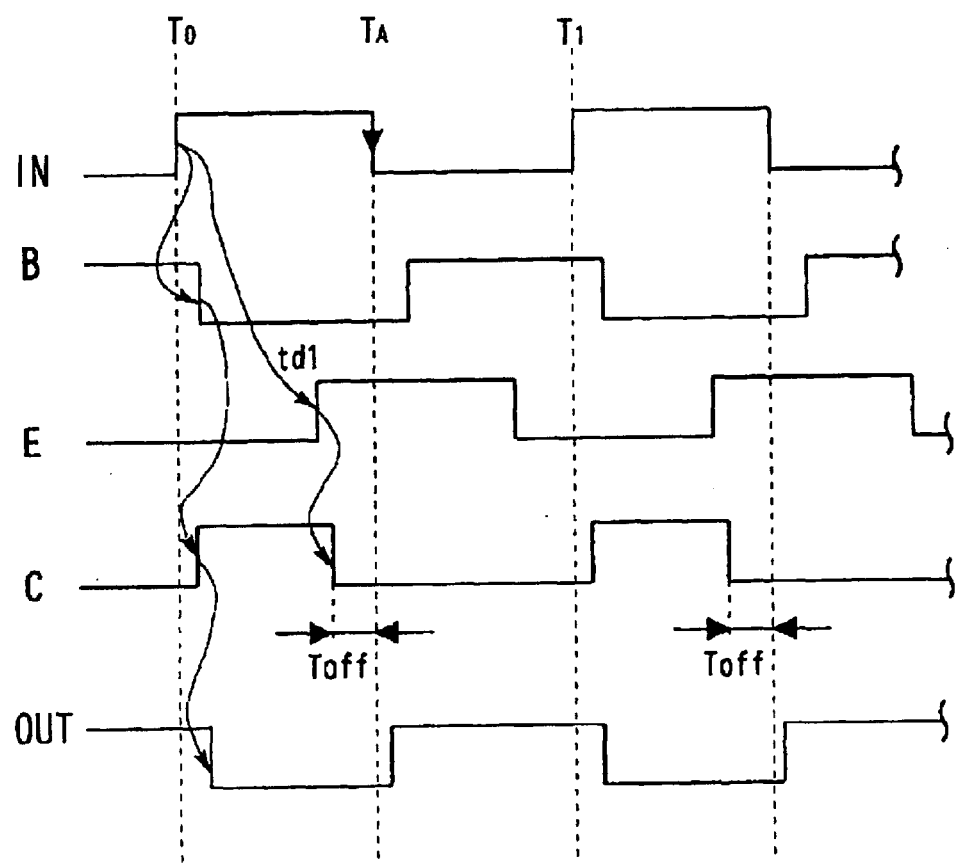
FIG. 10 is a timing chart for explaining an operation of the fourth embodiment of the present invention.

FIG. 10 is a timing chart showing an operation of the fourth embodiment of the present invention. In this embodiment, when the input signal fed to the input terminal IN rises from a low level to a high level (at $T_0$), the node B which is an output node of the inverter INV1 goes to a low level, in response to the transition of the input signal. At this time, because the output signal of the delay circuit 100 is still at a low level (a high-level signal is not outputted to the node E), the NOR circuit NOR1, which receives a low level at the node E, changes the output node C to a high level, in response to the transition of the node B to the low level. When the node C goes to a high level, the NMOS transistor NM1 is turned on, so that the output terminal OUT goes to a low level.

The delay circuit 100 that receives the input signal from the input terminal IN delays a rise of the input signal by a time td1, and outputs the delayed signal to the node E, which is the output terminal of the delay circuit 100. The NOR circuit NOR1 changes the node C from a high to a low level, in response to the rise transition of the node E from a low level to a high level. As a result, the NMOS transistor NM1 is turned off. At this time, the signal fed to the input terminal IN is at a high level, and the PMOS transistor PM1 and the NMOS transistor NM1 are both in an off state (refer to the period $T_{off}$ in FIG. 10).

Then, at the timing $T_A$ in FIG. 10, the input signal IN goes from a high level to a low level, the PMOS transistor PM1 is turned on, and the output terminal OUT goes to a high level. By adjusting the delay time of the delay circuit 100 to reduce the period $T_{off}$, the circuit for setting the output terminal OUT to a logic value immediately before the output terminal OUT is set in a high-impedance state, with the output terminal OUT being kept in the high-impedance state for a long time, becomes unnecessary. Incidentally, in this fourth embodiment, the flip-flop composed of two inverters (INV2 and INV3) may of course be connected to the output terminal OUT of the buffer circuit, as in the first and second embodiments. Incidentally, in FIG. 10, a timing of a fall transition of the clock signal supplied to the input terminal (IN) of the buffer circuit from a high level to a low level between the timings $T_0$ and $T_1$ is indicated by $T_A$, and the duty ratio of the clock signal supplied to the input terminal (IN) of the buffer circuit is set to 1:1 (50%), for simplicity. In this embodiment, the duty ratio of the clock signal may, of course, be other than 1:1.

Figure 11:
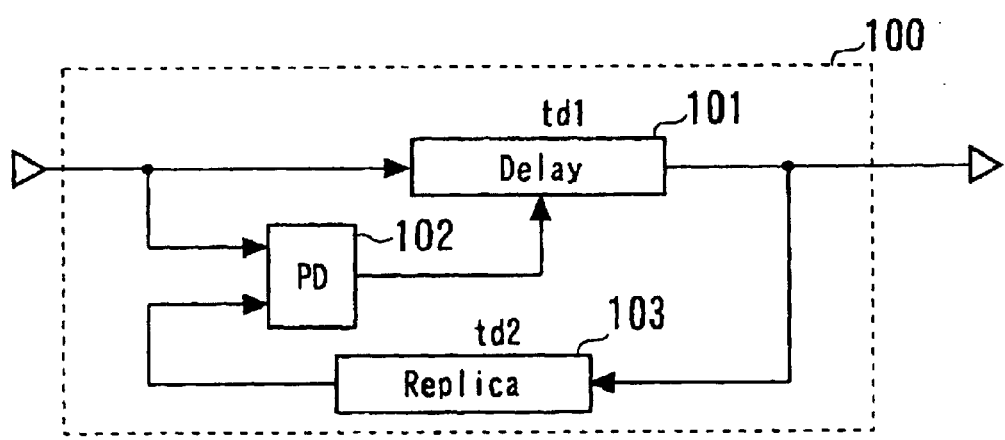
FIG. 11 is a block diagram showing a configuration of a delay circuit according to the fourth embodiment of the present invention.

The delay circuit 100 in FIG. 9 may be composed of a delay locked loop (DLL) as shown in FIG. 11, for example. That is, the delay circuit 100 includes a delay circuit 101 for receiving and then delaying an input signal, with its delay time made adjustable, a delay replica 103 for receiving and then delaying the output of the delay circuit 101 by a predetermined delay time, and a phase detection circuit 102 for comparing a phase of the output of the delay replica 103 with a phase of the input signal. The delay time of the delay circuit 101 is variably set, based on a result of detection by the phase detection circuit 102.

A rising edge of an input signal in a certain clock cycle is delayed by a delay time td1 at the delay circuit 101, and also delayed by a delay time td2 at the delay replica 103. At the phase detection circuit 102, the delay time of the delay circuit 101 is adjusted so that the phase of the rising edge of a signal in a subsequent cycle coincides with the phase of the output signal of the delay replica 103.

When the signal (clock) fed to the input terminal IN is a clock signal with a cycle tCK and a duty of 50% and the delay time of the delay replica 103 is set to td2, the delay time td1 of the delay circuit 101 is given by an equation:

$$td1=tCK-td2,$$

and the off period $T_{off}$ is given by an equation:

$$T_{off}=td2-tCK/2.$$

By setting the delay time td2 of the delay replica based on a typical value of the off period $T_{off}$, the node C is set to a low level by the period $T_{off}$ earlier with respect to a falling edge of the signal fed to the input terminal IN. Thus, when the PMOS transistor PM1 is turned on in response to a fall of the signal fed to the input terminal IN, the NMOS transistor NM1 is kept off.

In this embodiment, the delay circuit 100 is not limited to a DLL circuit. A synchronous type delay circuit that includes a first row of delay circuits and a second row of delay circuits with their clock propagation directions opposite to each other may also be employed. In this circuit, a clock pulse that has proceeded through the first row of the delay circuits is transferred to the second row of the delay circuits through a transfer circuit in response to a subsequent clock pulse in a direction opposite to the direction in which the clock pulse proceeded through the first row of the delay circuits.

Figure 12:
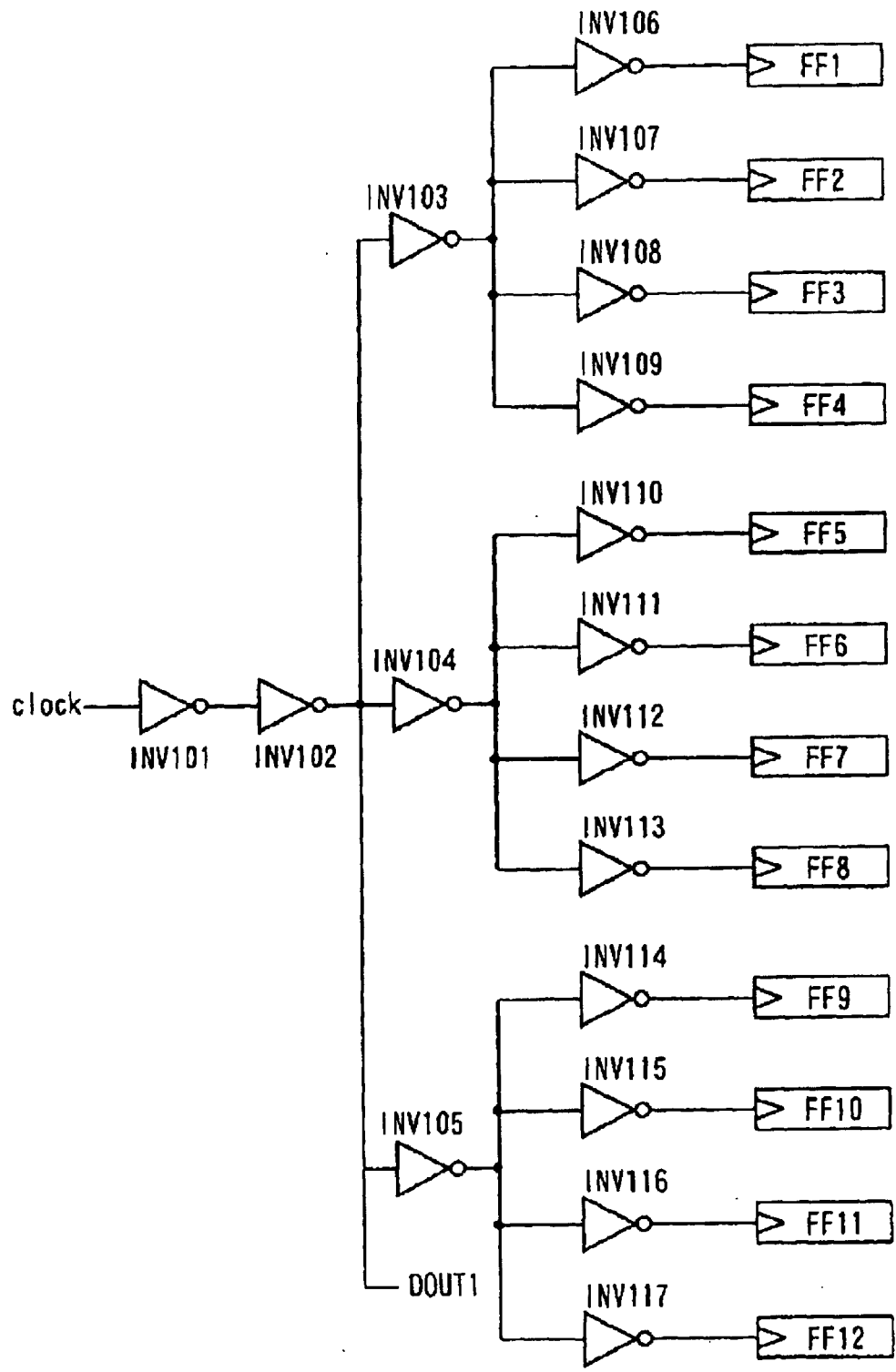
FIG. 12 is a block diagram showing a configuration of clock trees to which buffer circuits according to the embodiments of the present invention are applied.

When the buffer circuits of the present invention are incorporated into a semiconductor integrated circuit as clock tree buffers, a configuration becomes the one as shown in FIG. 12, for example. When flip-flops (or registers) FF1 through FF12 are configured to sample data at a rising edge of a clock, and four inverters are inserted into a clock tree, INV101 and INV103 to INV105 are composed of the inverting buffers shown in FIG. 5, and INV102 and INV106 to INV117 are composed of the inverting buffers shown in FIG. 1.

Figure 14:
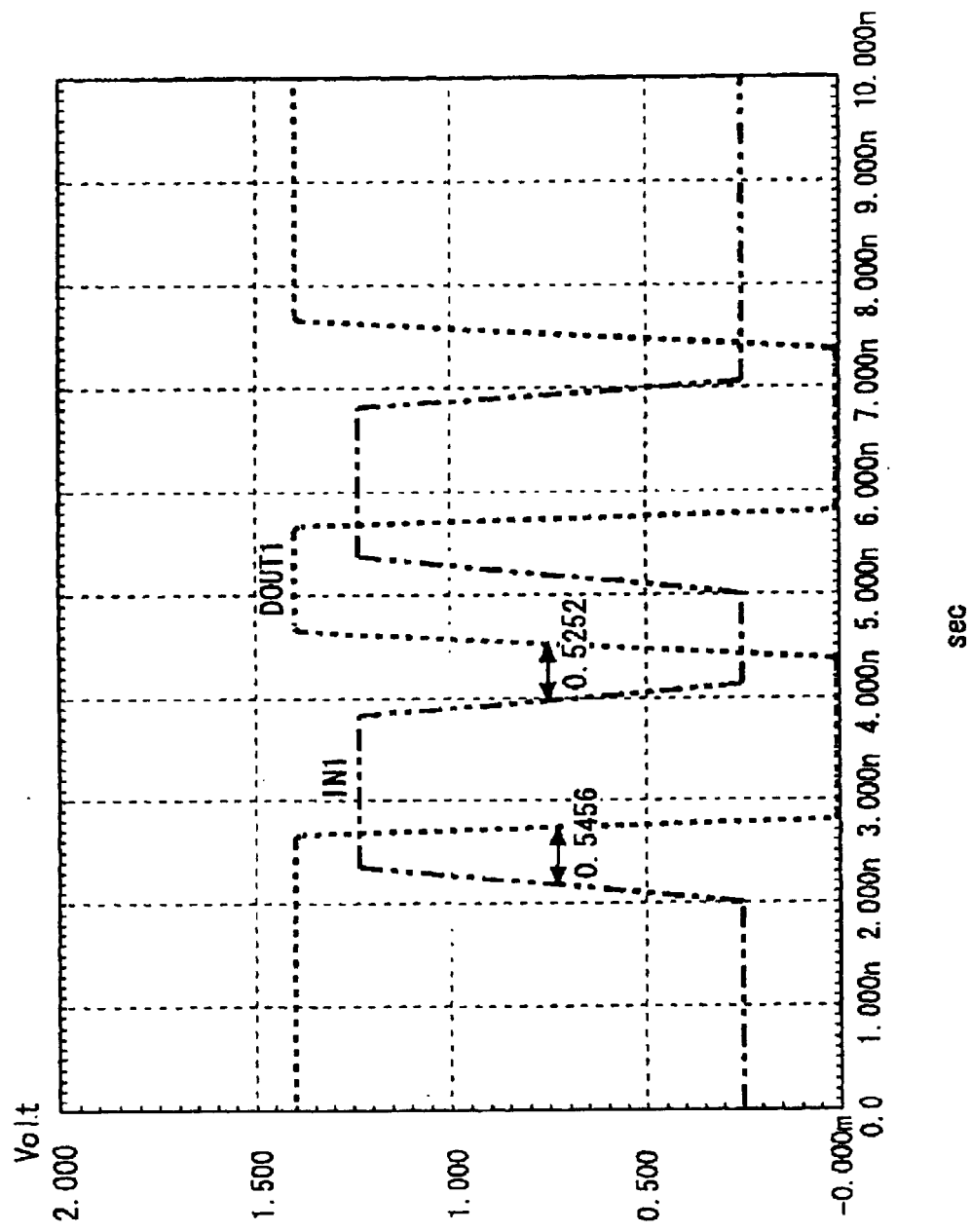
FIG. 14 is a graph showing the transient analysis simulation result of clock tree buffers that used CMOS inverters as a comparison example.

Next, a case where performance of clock tree buffers that use the buffer circuits according to the present invention was compared with performance of clock tree buffers that use conventional CMOS inverters to perform evaluation (benchmark) will be described. FIG. 14 is a graph as a comparison example, showing an input waveform IN1 and an output waveform DOUT1 resulting from a transient analysis simulation when inverting buffers composed of ordinary CMOS inverters were employed for two inverters INV101 and INV102 in FIG. 12. A ratio βp/βn of a gain coefficient β of the PMOS transistor to the gain coefficient β of the NMOS transistor at a first inverter in FIG. 12 is set to 150/75, while the ratio βp/βn of the gain coefficient β of the PMOS transistor to the gain coefficient β of the NMOS transistor at a second inverter in FIG. 12 is set to 400/200.

A signal from a receiver circuit (a differential inverting buffer circuit), not shown, is assumed to be supplied to the first CMOS inverter INV101 in FIG. 12. A minimum amplitude value and a maximum amplitude value of a signal (IN1) supplied to the receiver circuit is set to 0.25V and 1.25V, respectively. The clock cycle tCK is set to 3 ns, the duty ratio is set to 3:2, and a rise time is set to 0.3 ns. As shown in FIG. 14, the propagation delay time from a rise of the input signal IN1 to a fall of an output signal DOUT1 (in FIG. 12) that is the output of the CMOS inverter INV103 is 0.5456 ns (≈545 ps), and the propagation delay time from a fall of the input signal IN1 to a rise of the output signal DOUT1 is 0.5252 ns (≈525 ps).

Figure 13:
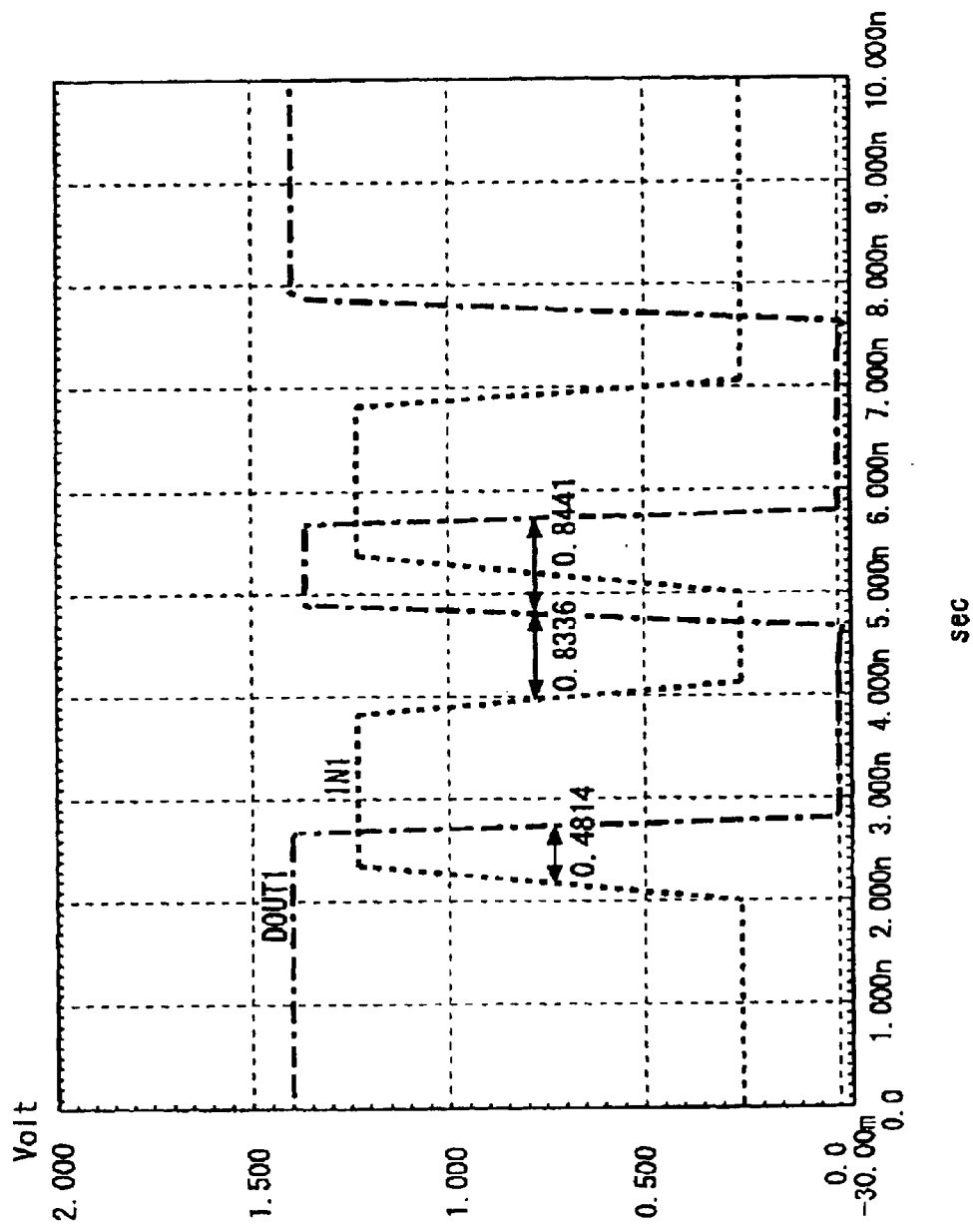
FIG. 13 is a graph showing a transient analysis simulation result of clock tree buffers that used the third embodiment of the present invention.

On the other hand, FIG. 13 is a graph showing the input waveform IN1 and the output waveform DOUT1 resulting from the transient analysis simulation when the buffer circuit 10B and the buffer circuit 10A shown in FIG. 8, according to the embodiment of the present invention are employed as the two inverters INV101 and INV102, respectively, in FIG. 12. The input terminal of the inverter INV101 in FIG. 12 is assumed to receive the output signal of the receiver circuit (inverting buffer circuit), not shown. The minimum amplitude value and the maximum amplitude value of the signal (IN1) supplied to the receiver circuit are set to 0.25V and 1.25V, respectively. The clock cycle tCK is set to 3 ns, the duty ratio is set to 3:2, and the rise time is set to 0.3 ns. The βp/βn of the first buffer circuit 10A (ratio of the gain coefficient β of the PMOS transistor PM11 to the gain coefficient β of the NMOS transistor NM11) is set to 180/80, while the βp/βn of the second buffer circuit 10B (ratio of the gain coefficient β of the PMOS transistor PM12 to the gain coefficient β of the NMOS transistor NM12) is set to 100/150. The propagation delay time from a rise of the input signal IN1 to a fall of the output signal DOUT1 (in FIG. 12) is 0.4814 ns (≈481 ps), and the propagation delay time from a fall of the input signal IN1 to a rise of the output signal DOUT1 (in FIG. 12) is 0.8336 ns (≈833 ps).

Referring to FIG. 13, the off period (a period where the DOUT1 is at a high level) is set to 0.8441 ns (844.1 ps). During this off period, in the buffer circuit 10B in FIG. 8, which constitutes the buffer INV102 in FIG. 12, the PMOS transistor PM12 is in an off state, (the NMOS transistor NM12 is also in an off state, and the output of the buffer circuit 10B is in a high-impedance state). Using the output of an inverter INV15 that constitutes a flip-flop, the output terminal OUT of the buffer circuit 10B in the off state is pulled up to the power supply voltage VDD. Based on comparison between these analysis results, the propagation delay time tpLH from a fall of the input fed to the receiver circuit to a rise of the output (DOUT1) in this embodiment is 481 ps, which is approximately 12% shorter than in the case of the configuration constituted from the conventional CMOS inverters.

Figure 15:
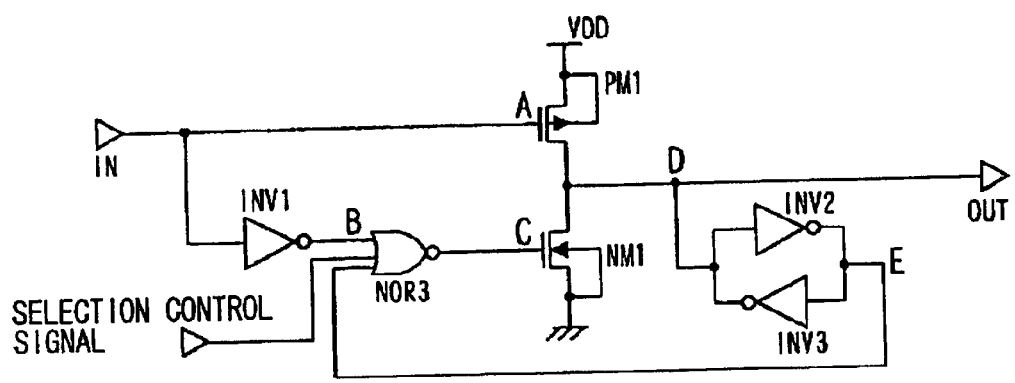
FIG. 15 is a block diagram showing a configuration of a fifth embodiment of the present invention.

Still another embodiment of the present invention will be described. FIG. 15 is a block diagram showing a configuration of a fifth embodiment of the present invention, and shows a variation of the first embodiment shown in FIG. 1. That is, referring to FIG. 15, a buffer circuit in the fifth embodiment of the present invention is configured by replacing the two-input NOR circuit NOR1 that receives the outputs of the inverter INV1 and the inverter INV2 in FIG. 1 with a three-input NOR circuit NOR3. The output signal of the inverter INV1, the output signal of the inverter INV2, and a selection control signal supplied from an outside of the buffer circuit are fed to three respective input terminals of the three-input NOR circuit NOR3. The configuration other than this is the same as that in the first embodiment.

An operation of the fifth embodiment of the present invention will be described below. When the selection control signal is at a high level, so as to deactivate the buffer circuit, the output of the three-input NOR circuit NOR3 is forcibly set to a low level, irrespective of values of other two input signals (other two input signals are masked). The NMOS transistor NM1 that receives the output signal of the three-input NOR circuit NOR3 at its gate is turned off irrespective of the value of the signal supplied to the input terminal IN. When the selection control signal goes to a high level, the NMOS transistor NM1 is kept from being turned on in this manner. Thus, the node D is fixed at a high level. That is, an output of the clock signal supplied to the input terminal IN of the buffer circuit is stopped.

On the other hand, when the selection control signal goes to a low level to activate the buffer circuit in the fifth embodiment of the present invention, the same operation as in the embodiment described with reference to FIG. 1 is performed. That is, when the selection control signal is at a low level, the three-input NOR circuit NOR3 outputs a high level when the values of other two input terminals, or the values of the output signals of the inverter INV1 and the inverter INV2 are both at a low level, (when the signals of the input terminal IN and the output terminal OUT are both at a high level). The NMOS transistor NM1 is thus turned on, and the node D goes to a low level. As a result, the output signal of the inverter INV2 goes to a high level, the three-input NOR circuit NOR3 outputs a low level to turn off the NMOS transistor NM1. When the input signal supplied to the input terminal IN goes to a low level, the PMOS transistor PM1 is switched on to charge the node D. At this time, the output signal of the inverter INV1 goes to a high level, the three-input NOR circuit NOR3 outputs a low level, and the NMOS transistor NM1 is kept off. Since the PMOS transistor PM1 is switched on while the NMOS transistor NM1 is kept off in this manner, the short-circuit current from the high-potential power supply VDD to the low-potential power supply VSS does not flow. Power consumption is thereby reduced, and the output terminal is charged at high speed. Since the fifth embodiment of the present invention can stop clocking as necessary while keeping high-speed supply of a high-level output, it is suited for being applied to a semiconductor device or the like that has a power saving function such as a standby mode.

Figure 16:
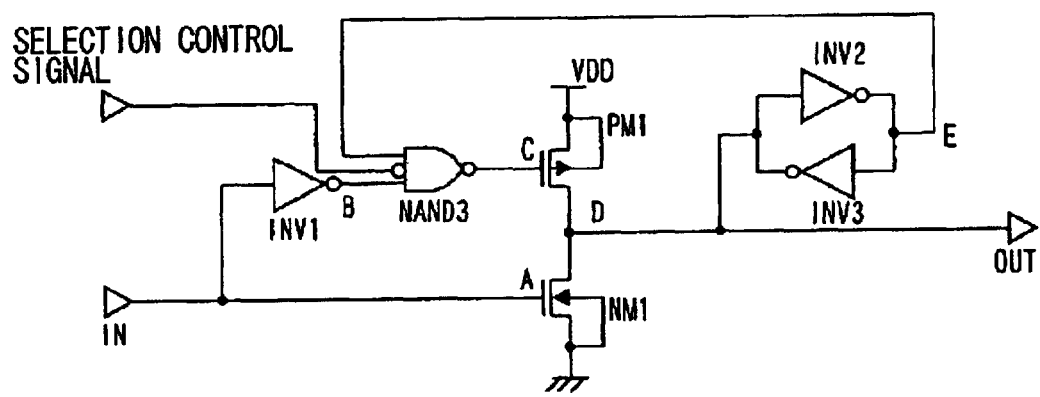
FIG. 16 is a block diagram showing a configuration of a sixth embodiment of the present invention.

FIG. 16 is a block diagram showing a configuration of a sixth embodiment of the present invention. The sixth embodiment of the present invention is a variation of the second embodiment described with reference to FIG. 5. That is, referring to FIG. 16, the sixth embodiment of the present invention is obtained by replacing the two-input NAND circuit NAND1 in FIG. 5 with a three-input NAND circuit NAND3. The output signal of the inverter INV1, the output signal of the inverter INV2, and the inverted signal of the selection control signal in FIG. 15 are input to the three respective input terminals of the three-input NAND circuit NAND3. The configuration other than this is the same as that in the second embodiment. In an example shown in FIG. 16, the selection control signal is used in common with the one shown in FIG. 15. Thus, the inverted signal of the selection control signal is input to the three-input NAND circuit NAND3. However, logic of the selection control signal can be arbitrarily set. If the logic levels of the selection control signal for activating and deactivating the buffer circuit in FIG. 16 are set to the high level and the low level, respectively, which are different from the example shown in FIG. 15, the selection control signal is supplied to the three-input NAND circuit NAND3.

An operation of the sixth embodiment of the present invention will be described below. When the selection control signal is set to a high level so as to deactivate the buffer circuit, the inverted signal of the selection control signal to be supplied to the three-input NAND circuit NAND3 goes to a low level. Then, the three-input NAND circuit NAND3 outputs a high level to turns off the PMOS transistor PM1. Since the PMOS transistor PM1 is kept from being turned on, the node D is fixed at a low level. That is, output of the clock signal supplied to the input terminal of the buffer circuit is stopped.

On the other hand, when the selection control signal is set to a low level so as to activate the buffer circuit, the same operation as in the embodiment described with reference to FIG. 5 is performed. That is, when the selection control signal is at a low level, the three-input NAND circuit NAND3 that receives its inverted signal outputs a low level if the values of other two input terminals or the values of output signals of the inverters INV1 and INV2 are both at a high level(when the signals of the input terminal IN and the output terminal OUT are both at a low level). The PMOS transistor is thus turned on, and the node D goes to a high level. As a result, the output signal of the inverter INV2 goes to a low level, and the three-input NAND circuit NAND3 outputs a high level to turn off the PMOS transistor PM1. When the input signal supplied to the input terminal IN goes to a high level, the NMOS transistor NM1 is switched on to discharge the node D. At this time, the output signal of the inverter INV1 goes to a low level, and the three-input NANA circuit NAND3 outputs a high level. The PMOS transistor PM1 is thus kept off. Since the NMOS transistor NM1 is switched from off to on with the PMOS transistor PM1 being kept off in this manner, the short-circuit current from the high-potential power supply VDD to the low-potential power supply VSS does not flow. Current consumption is thereby reduced, and the output terminal is discharged at high speed. Since this embodiment can stop clock supply as necessary while keeping high-speed supply of a low-level output, it is ideal for being applied to the semiconductor device or the like that has the power saving function such as the standby mode. Incidentally, either one or both of the NOR3 in the fifth embodiment of the present invention and the NAND 3 in the sixth embodiment of the present invention, shown in FIG. 15 and FIG. 16, respectively, may of course be applied to either one or both of the buffer circuits 10A and 10B in FIG. 8. The two-input NOR circuit NOR1 shown in FIG. 9 may of course be replaced with the three-input NOR circuit that further receives the selection control signal.

The foregoing descriptions were made in conjunction with the embodiments. The present invention, however, is not limited to the embodiments described above, and naturally includes various variations and modifications that could be made by those skilled in the art within the scope of the claims of the present invention.

The meritorious effects of the present invention are summarized as follows.

As described above, according to the buffer circuit of the present invention, a propagation delay time of a signal is reduced. When a buffer for delay adjustment according to the buffer circuit of the present invention is inserted into a clock path, an effect of the delay adjustment buffer on a timing margin for a clock destination is alleviated. The buffer circuit of the present invention is thus ideal for use in a buffer tree or the like equipped with a semiconductor integrated circuit. Further, the buffer circuit of the present invention can control propagation and stop of a signal based on a control signal for controlling activation/deactivation while maintaining a reduction in the delay time of the signal. The buffer circuit of the present invention is thus ideal for use in a buffer tree circuit in a high-speed semiconductor device with a power saving function or the like.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A buffer circuit having an input terminal for receiving an input signal and an output terminal for outputting an output signal, comprising:

a first transistor and a second transistor connected in series between a first power supply and a second power supply having different power supply voltages, each having a control terminal, said first and second transistors being controlled to be on and off based on signals respectively fed to said control terminals, a connection node between said first and second transistors being connected to said output terminal of said buffer circuit, said control terminal of said first transistor being connected to said input terminal of said buffer circuit; and a control circuit having at least an input terminal for receiving the input signal supplied to said input terminal of said buffer circuit, and an output terminal for outputting the signal to be supplied to said control terminal of said second transistor, said control circuit performing control so that when the input signal is at a second logic level corresponding to the voltage of said second power supply, said second transistor is turned off, when the input signal changes from the second logic level to a first logic level corresponding to the voltage of said first power supply, said second transistor is turned on to cause a voltage of an output signal of said output terminal of said buffer circuit to change to the voltage of said second power supply, thereafter, before the input signal undergoes a transition from the first logic level to the second logic level, said second transistor is set to be off, and when the input signal undergoes a transition from the first logic level to the second logic level and said first transistor is switched from off to on, said second transistor is kept off, wherein said control circuit further comprises:

an inverter having an input terminal for receiving the input signal supplied to said input terminal of said buffer circuit and an output terminal for outputting an inverted signal of the input signal;

a delay circuit for receiving the input signal supplied to said input terminal of said buffer circuit and outputting a delayed signal of the input signal; and a logic circuit having two input terminals for receiving the output signal from said inverter and the output signal from said delay circuit and having an output terminal for outputting a signal at a logic level for turning on said second transistor to said control terminal of said second transistor when the signals received at said two input terminals are both at the second logic level; and wherein the signal outputted from said delay circuit changes from the second logic level to the first logic level before a timing at which the input signal supplied to said input terminal of said buffer circuit changes from the first logic level to the second logic level, and when the input signal supplied to said input terminal of said buffer circuit changes from the first logic level to the second logic level, said second transistor is set to be in an off state.

2. The buffer circuit according to claim 1, wherein said delay circuit comprises a delay locked loop (DLL) circuit.

3. A buffer circuit including a first buffer having an input terminal for receiving an input signal and an output terminal for outputting an inverted signal of the input signal; and a second buffer circuit having an input terminal connected to said output terminal of said first buffer circuit, inverting the signal supplied to said input terminal and having an output terminal for outputting the inverted signal;

said first buffer circuit comprising:

a first transistor and a second transistor connected in series between a first power supply and a second power supply having different power supply voltages, each having a control terminal, said first and second transistors being controlled to be on and off based on signals respectively fed to said control terminals, a connection node between said first transistor and said second transistor being connected to said output terminal of said buffer circuit, said control terminal of said first transistor being connected to said input terminal of said buffer circuit; and a first control circuit having at least an input terminal for receiving the input signal supplied to said input terminal of said first buffer circuit, and having an output terminal for outputting the signal to be supplied to said control terminal of said second transistor, said first control circuit performing control so that when the input signal is at a second logic level corresponding to the voltage of said second power supply, said second transistor is turned off, when the input signal changes from the second logic level to a first logic level corresponding to the voltage of said first power supply, said second transistor is turned on to cause an output signal voltage of said output terminal of said buffer circuit to undergo a transition to the voltage of said second power supply, thereafter, before the input signal undergoes a transition from the first logic level to the second logic level, said second transistor is set to be off, and when the input signal undergoes a transition from the first logic level to the second logic level and said first transistor is switched from said off to on, said second transistor is kept off;

said second buffer circuit comprising:

a third transistor and a fourth transistor connected in series between said first power supply and said second power supply, being controlled to be on and off based on signals supplied to respective control terminals thereof, a connection node between said third transistor and said fourth transistor being connected to said output terminal of said second buffer circuit, said control terminal of said third transistor being connected to said input terminal of said second buffer circuit; and a second control circuit having at least an input terminal for receiving the output signal of said first buffer circuit supplied to said input terminal of said second buffer circuit and having an output terminal for outputting the signal to be supplied to said control terminal of said fourth transistor, said second control circuit performing control so that when the output signal of said first buffer circuit is at the first logic level, said fourth transistor is turned off, when the output signal of said first buffer circuit changes from the first logic level to the second logic level, said fourth transistor is turned on to cause an output signal voltage of said output terminal of said second buffer circuit to undergo a transition to the voltage of said first power supply, thereafter, before the output signal of said first buffer circuit undergoes a transition from the second logic level to the first logic level, said fourth transistor is set to be off, and when the output signal of said first buffer circuit changes from the second logic level to the first logic level and said third transistor is switched from off to on, said fourth transistor is kept in off.

4. The buffer circuit according to claim 3, wherein said first control circuit further includes an input terminal for receiving a selection control signal for controlling activation and deactivation of said first buffer circuit, said first control circuit outputting the signal at a logic level for turning, off said second transistor when the selection control signal indicates a value commanding deactivation of said first buffer circuit; and said second control circuit further includes an input terminal for receiving a selection control signal for controlling activation and deactivation of said second buffer circuit; said second control circuit outputting the signal at a logic level for turning off said fourth transistor when the selection control signal indicates a value commanding deactivation of said second buffer circuit.

5. A buffer tree circuit having a plurality of buffer circuits disposed in a tree form along clock interconnection paths, including as said plurality of buffer circuits, a plurality of first and second buffer circuits as defined in claim 3, and a plurality of the first buffer circuits cascaded alternately with a plurality of the second buffer circuits.

6. A buffer circuit comprising:

first and second MOS translators of mutually opposite conductivity types, connected in series between a high-potential power supply and a low-potential power supply, a connection node between a drain of said first MOS transistor and a drain of said second MOS transistor being connected to an output terminal of said butter circuit, a gate of said first MOS transistor being connected to an input terminal of said buffer circuit; and a control circuit receiving an input signal supplied to said input terminal of said buffer circuit and outputting a signal to be supplied to a gate of said second MOS transistor, said control circuit performing control so that when the input signal is at a second logic level corresponding to a voltage of said low-potential power supply, said second MOS transistor is turned off, when the input signal is at a first logic level corresponding to a voltage of said high-potential power supply, said second MOS transistor is turned on to cause a voltage of an output signal of said output terminal of said buffer circuit to undergo a transition to the voltage of said low-potential power supply, thereafter, before the input signal undergoes a transition from the first logic level to the second logic level, the signal supplied to said gate of said second MOS transistor is set at the second logic level to turn off said second MOS transistor, and when the input signal undergoes a transition from the first logic level to the second logic level to cause said first MOS transistor to transition from off to on, said second MOS transistor is kept off.

7. The buffer circuit according to claim 6, wherein said control circuit comprises:

a first inverter having an input terminal for receiving the input signal supplied to said input terminal of said buffer circuit and an output terminal for outputting an inverted signal of the input signal; and a logic circuit having two input terminals for receiving the output signal from said first inverter and an inverted signal of the output signal of said output terminal of said buffer circuit and having an output terminal for outputting the signal at a logic level for turning on said second MOS transistor to a control terminal of said second MOS transistor when the signals input to said two input terminals are both at the second logic level.

8. The buffer circuit according to claim 6, further comprising:

a flip-flop including a second inverter having an input terminal connected to said output terminal of said buffer circuit and a third inverter having an input terminal connected to an output terminal of said second inverter and having an output terminal connected to said output terminal of said buffer circuit;

wherein said logic circuit of said control circuit receives an output signal of said first inverter and an output signal of said second inverter at said two respective input terminal thereof.

9. The buffer circuit according to claim 6, wherein said control circuit comprises:

a first inverter having an input terminal for receiving the input signal supplied to said input terminal of said buffer circuit and an output terminal for outputting an inverted signal of the input signal;

a delay circuit receiving the input signal supplied to said input terminal of said buffer circuit and delaying the input signal to output the delayed signal; and a logic circuit having two input terminals for receiving the output signal from said first inverter and the output signal of said delay circuit and having an output terminal for outputting a signal at a logic level for turning on said second MOS transistor to a control terminal of said second MOS transistor when the signals input to said two input terminals are both at the second logic level.

10. The buffer circuit according to claim 6, wherein said control circuit comprises:

a first inverter having an input terminal for receiving the input signal supplied to said input terminal of said buffer circuit and an output terminal for outputting an inverted signal of the input terminal; and a logic circuit having first, second and third input terminals for receiving the output signal of said first inverter, an inverted signal of the output signal of said output terminal of said buffer circuit, and a selection control signal for controlling activation and deactivation of said buffer circuit or an inverted signal of the selection control signal, respectively, said logic circuit having an output terminal for outputting the signal at a logic level for turning on said second MOS transistor to a control terminal of said second MOS transistor when the selection control signal supplied to said third input terminal command activation of said buffer circuit and the signals supplied to said first and second input terminals are both at the second logic level, said logic circuit outputting the signal at a logic level for turning off said second MOS transistor to said control terminal of said second MOS transistor from said output terminal thereof when the selection control signal supplied to said third input terminal commands deactivation of said buffer circuit.

11. The buffer circuit according to claim 10, further comprising:
a flip-flop including a second inverter having an input terminal connected to said output terminal of said buffer circuit and
a third inverter having an input terminal connected to an output terminal of said second inverter and an output terminal connected to said output terminal of said buffer circuit;
wherein said logic circuit of said control circuit receives the output signal of said first inverter, an output signal of said second inverter, and the selection control signal or the inverted signal thereof at said three respective input terminals.

12. A semiconductor integrated circuit comprising said buffer circuit as defined in claim 6 as a clock tree buffer.

13. A buffer circuit having an input terminal for receiving an input signal and an output terminal for outputting an output signal, comprising:
a first transistor and a second transistor connected in series between a first power supply and a second power supply having different power supply voltages, each having a control terminal,
said first and second transistors being controlled to be on and off based on signals respectively fed to said control terminals,
a connection node between said first and second transistors being connected to said output terminal of said buffer circuit,
said control terminal of said first transistor being connected to said input terminal of said buffer circuit; and
a control circuit having at least an input terminal for receiving the input signal supplied to said input terminal of said buffer circuit, and an output terminal for outputting the signal to be supplied to said control terminal of said second transistor, said control circuit performing control so that
when the input signal is at a second logic level corresponding to the voltage of said second power supply, said second transistor is turned off,
when the input signal changes from the second logic level to a first logic level corresponding to the voltage of said first power supply, said second transistor is turned on to cause a voltage of an output signal of said output terminal of said buffer circuit to change to the voltage of said second power supply,
thereafter, before the input signal undergoes a transition from the first logic level to the second logic level, said second transistor is set to be off, and
when the input signal undergoes a transition from the first logic level to the second logic level and said first transistor is switched from off to on, said second transistor is kept off;
wherein said control circuit farther includes an input terminal for receiving a selection control signal for controlling activation and deactivation of said buffer circuit; and
said control circuit outputting the signal at a logic level for turning off said second transistor when the selection control signal input thereto indicates a value commanding deactivation of said buffer circuit.

14. A buffer circuit having an input terminal for receiving an input signal and an output terminal for outputting an output signal, comprising:
a first transistor and a second transistor connected in series between a first power supply and a second power supply having different power supply voltages, each having a control terminal,
said first and second transistors being controlled to be on and off based on signals respectively fed to said control terminals,
a connection node between said first and second transistors being connected to said output terminal of said buffer circuit,
said control terminal of said first transistor being connected to said input terminal of said buffer circuit; and
a control circuit having at least an input terminal for receiving the input signal supplied to said input terminal of said buffer circuit, and an output terminal for outputting the signal to be supplied to said control terminal of said second transistor, said control circuit performing control so that
when the input signal is at a second logic level corresponding to the voltage of said second power supply, said second transistor is turned off,
when the input signal changes from the second logic level to a first logic level corresponding to the voltage of said first power supply, said second transistor is turned on to cause a voltage of an output signal of said output terminal of said buffer circuit to change to the voltage of said second power supply,
thereafter, before the input signal undergoes a transition from the first logic level to the second logic level, said second transistor is set to be off, and
when the input signal undergoes a transition from the first logic level to the second logic level and said first transistor is switched from off to on, said second transistor is kept off,
wherein said control circuit further comprises:
a logic circuit receiving the input signal supplied to said input terminal of said buffer circuit, the output signal outputted from said output terminal of said buffer circuit, and a selection control signal for controlling activation and deactivation of said buffer circuit or an inverted signal of the selection control signal, and
generating the signal to be supplied to said control terminal of said second transistor based on a result of a logic operation on the signals received; and wherein
said logic circuit outputs the signal at a logic level for turning off said second transistor to said control terminal of said second transistor from an output terminal thereof irrespective of values of the other two signals input to said logic circuit when the selection control signal commands deactivation of said buffer circuit,
generates the signal at a logic level for turning on said second transistor for supply to said control terminal of said second transistor when the selection control signal commands activation of said buffer circuit and the input signal supplied to said input terminal of said buffer circuit and the output signal outputted from said buffer circuit are both at the first logic level, and
generates the signal at said logic level for turning off said second transistor for supply to said control terminal of said second transistor when said second transistor is then turned on and the output signal outputted from said output terminal of said buffer circuit becomes the second logic level.

15. A buffer circuit having an input terminal for receiving an input signal and an output terminal for outputting an output signal, comprising:

a first transistor and a second transistor connected in series between a first power supply and a second power supply having different power supply voltages, each having a control terminal, said first and second transistors being controlled to be on and off based on signals respectively fed to said control terminals, a connection node between said first and second transistors being connected to said output terminal of said buffer circuit, said control terminal of said first transistor being connected to said input terminal of said buffer circuit; and a control circuit having at least an input terminal for receiving the input signal supplied to said input terminal of said buffer circuit, and an output terminal for outputting the signal to be supplied to said control terminal of said second transistor, said control circuit performing control so that when the input signal is at a second logic level corresponding to the voltage of said second power supply, said second transistor is turned off, when the input signal changes from the second logic level to a first logic level corresponding to the voltage of said first power supply, said second transistor is turned on to cause a voltage of an output signal of said output terminal of said buffer circuit to change to the voltage of said second power supply, thereafter, before the input signal undergoes a transition from the first logic level to the second logic level, said second transistor is set to be off, and when the input signal undergoes a transition from the first logic level to the second logic level and said first transistor is switched from off to on, said second transistor is kept off further comprising a flip-flop circuit having an input terminal connected to said output terminal of said buffer circuit, for storing and holding a logic level of the output signal of said buffer circuit and having an output terminal for outputting a signal which said flip-flop circuit stores and holds, said output terminal of said flip-flap circuit being connected to said output terminal of said buffer circuit, wherein said control circuit further comprises:

an inverter having an input terminal for receiving the input signal supplied to said input terminal of said buffer circuit and an output terminal for outputting an inverted signal of the input signal; and a logic circuit having first, second and third input terminals for receiving a signal at a logic level inverted from said logic level of the output signal of the output terminal of said buffer circuit and stored and held in said flip-flop circuit, the output signal of said inverter, and a selection control signal for controlling activation and deactivation of said buffer circuit or an inverted signal of the selection control signal respectively;

said logic circuit having an output terminal for outputting the signal at a logic level for turning on said second transistor to said control terminal of said second transistor when the selection control signal supplied to said third input terminal indicates a value commanding activation of said buffer circuit and the signals supplied to said first and second input terminals are both at the second logic level, said logic circuit outputting the signal at a logic level for turning off said second transistor from said output terminal thereof to said control terminal of said second transistor from said output terminal thereof, irrespective of values of the other two input signals, when the selection control signal commands deactivation of said buffer circuit.

16. A buffer circuit having an input terminal for receiving an input signal and an output terminal for outputting an output signal, comprising:

a first transistor and a second transistor connected in series between a first power supply and a second power supply having different power supply voltages, each having a control terminal, said first and second transistors being controlled to be on and off based on signals respectively fed to said control terminals, a connection node between said first and second transistors being connected to said output terminal of said buffer circuit, said control terminal of said first transistor being connected to said input terminal of said buffer circuit; and a control circuit having at least an input terminal for receiving the input signal supplied to said input terminal of said buffer circuit, and an output terminal for outputting the signal to be supplied to said control terminal of said second transistor, said control circuit performing control so that when the input signal is at a second logic level corresponding to the voltage of said second power supply, said second transistor is turned off, when the input signal changes from the second logic level to a first logic level corresponding to the voltage of said first power supply, said second transistor is turned on to cause a voltage of an output signal of said output terminal of said buffer circuit to change to the voltage of said second power supply, thereafter, before the input signal undergoes a transition from the first logic level to the second logic level, said second transistor is set to be off, and when the input signal undergoes a transition from the first logic level to the second logic level and said first transistor is switched from off to on, said second transistor is kept off, wherein said control circuit further comprises:

an inverter having an input terminal for receiving the input signal supplied to said input terminal of said buffer circuit and an output terminal for outputting an inverted signal of the input signal;

a delay circuit for receiving the input signal supplied to said input terminal of said buffer circuit and outputting a delayed signal of the input signal; and a logic circuit having first, second and third input terminals for receiving the output signal of said invertor, the output signal of said delay circuit, and a selection control signal for controlling activation and deactivation of said buffer circuit or an inverted signal of selection control signal, respectively, said logic circuit having an output terminal for outputting a signal at a logic level for turning on said second transistor to said control terminal of said second transistor when the selection control signal supplied to said third input terminal indicates a value commanding activation of said buffer circuit and the signals supplied to said first and second input terminals are both at the second logic level, said logic circuit outputting a signal at a logic level for turning off said second transistor to said control terminal of said second transistor from said output terminal, irrespective of values of the signals input to said first and second input terminals, when the selection control signal commands deactivation of said buffer circuit;

wherein when said buffer circuit is activated, the signal outputted from said delay circuit changes from the second logic level to the first logic level before a timing at which the input signal supplied to said input terminal of said buffer circuit changes from the first logic level to the second logic level, and when the input signal supplied to said input terminal of said buffer circuit changes from the first logic level to the second logic level, said second transistor is set to be off.

17. A buffer circuit comprising:

first and second MOS transistors of mutually opposite conductivity types, connected in series between a high-potential power supply and a low-potential power supply, a connection node between a drain of said first MOS transistor and a drain of said second MOS transistor being connected to an output terminal of said buffer circuit, a gate of said first MOS transistor being connected to an input terminal of said buffer circuit; and a control circuit receiving an input signal supplied to an input terminal of said buffer circuit and outputting a signal to be supplied to a gate of said second MOS transistor, said control circuit performing control so that when the input signal is at a second logic level corresponding to a voltage of said high-potential power supply, said second MOS transistor is turned off, when the input signal is at a first logic level corresponding to a voltage of said low-potential power supply, said second MOS transistor is turned on to cause a voltage of an output signal of said output terminal of said buffer circuit to undergo a transition to the voltage of said high-potential power supply, thereafter, before the input signal undergoes a transition from the first logic level to the second logic level, the signal supplied to said gate of said second MOS transistor as set at the second logic level to turn off said second MOS transistor, and when the input signal undergoes a transition from the first logic level to the second logic level and said first MOS transistor undergoes a transition from off to on, said second MOS transistor is kept off, wherein said control circuit further comprises:

a first inverter having an input terminal for receiving die input signal supplied to said input terminal of said buffer circuit and an output terminal for outputting an inverted signal of the input signal;

a delay circuit receiving the input signal supplied to said input terminal of said buffer circuit and delaying the input signal to output the delayed signal; and a logic circuit having two input terminal for receiving the output signal from said first inverter and the output signal of said delay circuit and having an output terminal for outputting a signal at a logic level for turning on said second MOS transistor to a control terminal of said second MOS transistor when the signals input to said two input terminals are both at the second logic level.

* * * * *

UNITED STATES PATENT AND TRADEMARK OFFICE
CERTIFICATE OF CORRECTION

PATENT NO. : 6,933,750 B2
DATED : August 23, 2005
INVENTOR(S) : Takahashi et al.

It is certified that error appears in the above-identified patent and that said Letters Patent is hereby corrected as shown below:

Column 23,
Line 42, "butter" should be -- buffer --.

Column 27,
Line 48, "flip-flap" should be -- flip-flop --.

Column 30,
Line 22, "die" should be -- the --.

Signed and Sealed this

Sixth Day of June, 2006

JON W. DUDAS
*Director of the United States Patent and Trademark Office*